United States Patent
Watson et al.

(10) Patent No.: US 9,136,983 B2
(45) Date of Patent: Sep. 15, 2015

(54) STREAMING AND BUFFERING USING VARIABLE FEC OVERHEAD AND PROTECTION PERIODS

(75) Inventors: Mark Watson, San Francisco, CA (US); Michael G. Luby, Berkeley, CA (US)

(73) Assignee: Digital Fountain, Inc., San Diego, CA (US)

( * ) Notice: Subject to any disclaimer, the term of this patent is extended or adjusted under 35 U.S.C. 154(b) by 1353 days.

(21) Appl. No.: 11/674,625

(22) Filed: Feb. 13, 2007

(65) Prior Publication Data

US 2007/0204196 A1 Aug. 30, 2007

Related U.S. Application Data

(60) Provisional application No. 60/773,501, filed on Feb. 14, 2006, provisional application No. 60/773,185, filed on Feb. 13, 2006.

(51) Int. Cl.
| | |
|---|---|
| *H04L 27/00* | (2006.01) |
| *H04L 1/16* | (2006.01) |
| *H03M 13/37* | (2006.01) |
| *H04L 1/00* | (2006.01) |

(52) U.S. Cl.
CPC .......... *H04L 1/1607* (2013.01); *H04L 1/0041* (2013.01); *H04L 1/0083* (2013.01); *H03M 13/3761* (2013.01); *H04L 1/0009* (2013.01)

(58) Field of Classification Search
CPC .......... H04L 2001/0093; H04L 1/0042; H04L 1/0002; H04L 1/0083; H04L 1/0057; H04L 1/0078; H04L 1/0004; H04N 21/2383
USPC ............ 375/295, 296; 714/751, 752, 746
See application file for complete search history.

(56) References Cited

U.S. PATENT DOCUMENTS

| | | | |
|---|---|---|---|
| 3,909,721 | A | 9/1975 | Bussgang et al. |
| 4,365,338 | A | 12/1982 | McRae et al. |
| 4,589,112 | A | 5/1986 | Karim |
| 4,901,319 | A | 2/1990 | Ross |

(Continued)

FOREIGN PATENT DOCUMENTS

| | | |
|---|---|---|
| CN | 1338839 A | 3/2002 |
| CN | 1425228 A | 6/2003 |

(Continued)

OTHER PUBLICATIONS

International Search Report PCT/US07/62086.

(Continued)

*Primary Examiner* — Leila Malek
(74) *Attorney, Agent, or Firm* — Ryan N. Farr

(57) ABSTRACT

Data is streamed from a transmitter to a receiver, wherein streaming is transferring data with an assumption that the receiver will begin using the data before it is all transmitted and received and the streamed data includes forward error correction ("FEC") and the rates of data consumption can vary. The transmitter has an input rate and a transmit rate and the two rates can be different and can change. At the receiver, there is a reception rate (at which the receiver receives data) and a consumption rate (at which the receiver uses up data for its output). The transmitter transmits using a transmit rate higher than the consumption rate and the extra bandwidth is usable for FEC protection and buffering. In some embodiments, the excess rate varies over a transmission period.

6 Claims, 4 Drawing Sheets

(56) References Cited

U.S. PATENT DOCUMENTS

| | | |
|---|---|---|
| 5,136,592 A | 8/1992 | Weng |
| 5,153,591 A | 10/1992 | Clark |
| 5,329,369 A | 7/1994 | Willis et al. |
| 5,331,320 A | 7/1994 | Cideciyan et al. |
| 5,371,532 A | 12/1994 | Gelman et al. |
| 5,372,532 A | 12/1994 | Robertson, Jr. |
| 5,379,297 A | 1/1995 | Glover et al. |
| 5,421,031 A | 5/1995 | De Bey |
| 5,425,050 A | 6/1995 | Schreiber et al. |
| 5,432,787 A | 7/1995 | Chethik |
| 5,455,823 A | 10/1995 | Noreen et al. |
| 5,465,318 A | 11/1995 | Sejnoha |
| 5,517,508 A | 5/1996 | Scott |
| 5,524,025 A | 6/1996 | Lawrence et al. |
| 5,566,208 A | 10/1996 | Balakrishnan |
| 5,568,614 A | 10/1996 | Mendelson et al. |
| 5,583,784 A | 12/1996 | Kapust et al. |
| 5,608,738 A | 3/1997 | Matsushita |
| 5,617,541 A | 4/1997 | Albanese et al. |
| 5,642,365 A | 6/1997 | Murakami et al. |
| 5,659,614 A | 8/1997 | Bailey, III |
| 5,699,473 A | 12/1997 | Kim |
| 5,701,582 A | 12/1997 | DeBey |
| 5,751,336 A | 5/1998 | Aggarwal et al. |
| 5,754,563 A | 5/1998 | White |
| 5,757,415 A | 5/1998 | Asamizuya et al. |
| 5,802,394 A | 9/1998 | Baird et al. |
| 5,805,825 A | 9/1998 | Danneels et al. |
| 5,835,165 A | 11/1998 | Keate et al. |
| 5,844,636 A | 12/1998 | Joseph et al. |
| 5,852,565 A | 12/1998 | Demos |
| 5,870,412 A | 2/1999 | Schuster et al. |
| 5,903,775 A | 5/1999 | Murray |
| 5,917,852 A | 6/1999 | Butterfield et al. |
| 5,926,205 A | 7/1999 | Krause et al. |
| 5,933,056 A | 8/1999 | Rothenberg |
| 5,936,659 A | 8/1999 | Viswanathan et al. |
| 5,936,949 A | 8/1999 | Pasternak et al. |
| 5,953,537 A | 9/1999 | Balicki et al. |
| 5,970,098 A | 10/1999 | Herzberg |
| 5,983,383 A | 11/1999 | Wolf |
| 5,993,056 A | 11/1999 | Vaman et al. |
| 6,005,477 A | 12/1999 | Deck et al. |
| 6,011,590 A | 1/2000 | Saukkonen |
| 6,012,159 A | 1/2000 | Fischer et al. |
| 6,014,706 A | 1/2000 | Cannon et al. |
| 6,018,359 A | 1/2000 | Kermode et al. |
| 6,041,001 A | 3/2000 | Estakhri |
| 6,044,485 A | 3/2000 | Dent et al. |
| 6,061,820 A | 5/2000 | Nakakita et al. |
| 6,073,250 A | 6/2000 | Luby et al. |
| 6,079,041 A | 6/2000 | Kunisa et al. |
| 6,079,042 A | 6/2000 | Vaman et al. |
| 6,081,907 A | 6/2000 | Witty et al. |
| 6,081,909 A | 6/2000 | Luby et al. |
| 6,081,918 A | 6/2000 | Spielman |
| 6,088,330 A | 7/2000 | Bruck et al. |
| 6,097,320 A | 8/2000 | Kuki et al. |
| 6,134,596 A | 10/2000 | Bolosky et al. |
| 6,141,053 A | 10/2000 | Saukkonen |
| 6,141,787 A | 10/2000 | Kunisa et al. |
| 6,141,788 A | 10/2000 | Rosenberg et al. |
| 6,154,452 A | 11/2000 | Marko et al. |
| 6,163,870 A | 12/2000 | Luby et al. |
| 6,166,544 A | 12/2000 | Debbins et al. |
| 6,175,944 B1 | 1/2001 | Urbanke et al. |
| 6,178,536 B1 | 1/2001 | Sorkin |
| 6,185,265 B1 | 2/2001 | Campanella |
| 6,195,777 B1 | 2/2001 | Luby et al. |
| 6,223,324 B1 | 4/2001 | Sinha et al. |
| 6,226,259 B1 | 5/2001 | Piret |
| 6,226,301 B1 | 5/2001 | Cheng et al. |
| 6,229,824 B1 | 5/2001 | Marko |
| 6,243,846 B1 | 6/2001 | Schuster et al. |
| 6,272,658 B1 | 8/2001 | Steele et al. |
| 6,278,716 B1 | 8/2001 | Rubenstein et al. |
| 6,298,462 B1 | 10/2001 | Yi |
| 6,307,478 B1 | 10/2001 | Luby |
| 6,314,289 B1 | 11/2001 | Eberlein et al. |
| 6,320,520 B1 | 11/2001 | Luby |
| 6,332,163 B1 | 12/2001 | Bowman-Amuah |
| 6,333,926 B1 | 12/2001 | Van Heeswyk et al. |
| 6,373,406 B2 | 4/2002 | Luby |
| 6,393,065 B1 | 5/2002 | Piret et al. |
| 6,411,223 B1 | 6/2002 | Haken et al. |
| 6,415,326 B1 | 7/2002 | Gupta et al. |
| 6,420,982 B1 | 7/2002 | Brown |
| 6,421,387 B1 | 7/2002 | Rhee |
| 6,430,233 B1 | 8/2002 | Dillon et al. |
| 6,445,717 B1 | 9/2002 | Gibson et al. |
| 6,459,811 B1 | 10/2002 | Hurst, Jr. |
| 6,466,698 B1 | 10/2002 | Creusere |
| 6,473,010 B1 | 10/2002 | Vityaev et al. |
| 6,486,803 B1 | 11/2002 | Luby et al. |
| 6,487,692 B1 | 11/2002 | Morelos-Zaragoza |
| 6,496,980 B1 | 12/2002 | Tillman et al. |
| 6,497,479 B1 | 12/2002 | Stoffel et al. |
| 6,510,177 B1 | 1/2003 | De et al. |
| 6,523,147 B1 | 2/2003 | Kroeger et al. |
| 6,535,920 B1 | 3/2003 | Parry et al. |
| 6,577,599 B1 | 6/2003 | Gupta et al. |
| 6,584,543 B2 | 6/2003 | Williams et al. |
| 6,609,223 B1 | 8/2003 | Wolfgang |
| 6,614,366 B2 | 9/2003 | Luby |
| 6,618,451 B1 | 9/2003 | Gonikberg |
| 6,631,172 B1 | 10/2003 | Shokrollahi et al. |
| 6,633,856 B2 | 10/2003 | Richardson et al. |
| 6,641,366 B2 | 11/2003 | Nordhoff |
| 6,643,332 B1 | 11/2003 | Morelos-Zaragoza et al. |
| 6,677,864 B2 | 1/2004 | Khayrallah |
| 6,678,855 B1 | 1/2004 | Gemmell |
| 6,694,476 B1 | 2/2004 | Sridharan et al. |
| 6,704,370 B1 | 3/2004 | Chheda et al. |
| 6,732,325 B1 | 5/2004 | Tash et al. |
| 6,742,154 B1 | 5/2004 | Barnard |
| 6,748,441 B1 | 6/2004 | Gemmell |
| 6,751,772 B1 | 6/2004 | Kim et al. |
| 6,765,866 B1 | 7/2004 | Wyatt |
| 6,804,202 B1 | 10/2004 | Hwang |
| 6,810,499 B2 | 10/2004 | Sridharan et al. |
| 6,820,221 B2 | 11/2004 | Fleming |
| 6,831,172 B1 | 12/2004 | Barbucci et al. |
| 6,849,803 B1 | 2/2005 | Gretz |
| 6,850,736 B2 | 2/2005 | McCune, Jr. |
| 6,856,263 B2 | 2/2005 | Shokrollahi et al. |
| 6,868,083 B2 | 3/2005 | Apostolopoulos et al. |
| 6,876,623 B1 | 4/2005 | Lou et al. |
| 6,882,618 B1 | 4/2005 | Sakoda et al. |
| 6,895,547 B2 | 5/2005 | Eleftheriou et al. |
| 6,909,383 B2 | 6/2005 | Shokrollahi et al. |
| 6,928,603 B1 | 8/2005 | Castagna et al. |
| 6,937,618 B1 | 8/2005 | Noda et al. |
| 6,956,875 B2 | 10/2005 | Kapadia et al. |
| 6,965,636 B1 | 11/2005 | DesJardins et al. |
| 6,985,459 B2 | 1/2006 | Dickson |
| 6,995,692 B2 | 2/2006 | Yokota et al. |
| 7,010,052 B2 | 3/2006 | Dill et al. |
| 7,030,785 B2 | 4/2006 | Shokrollahi et al. |
| 7,031,257 B1 | 4/2006 | Lu et al. |
| 7,057,534 B2 | 6/2006 | Luby |
| 7,068,681 B2 | 6/2006 | Chang et al. |
| 7,068,729 B2 | 6/2006 | Shokrollahi et al. |
| 7,072,971 B2 | 7/2006 | Lassen et al. |
| 7,073,191 B2 | 7/2006 | Srikantan et al. |
| 7,100,188 B2 | 8/2006 | Hejna et al. |
| 7,110,412 B2 | 9/2006 | Costa et al. |
| 7,139,660 B2 | 11/2006 | Sarkar et al. |
| 7,139,960 B2 | 11/2006 | Shokrollahi |
| 7,143,433 B1 | 11/2006 | Duan et al. |
| 7,151,754 B1 | 12/2006 | Boyce et al. |
| 7,154,951 B2 | 12/2006 | Wang |
| 7,164,370 B1 | 1/2007 | Mishra |
| 7,164,882 B2 | 1/2007 | Poltorak |
| 7,168,030 B2 | 1/2007 | Ariyoshi |

(56) References Cited

U.S. PATENT DOCUMENTS

| | | |
|---|---|---|
| 7,219,289 B2 | 5/2007 | Dickson |
| 7,231,404 B2 | 6/2007 | Paila et al. |
| 7,233,264 B2 | 6/2007 | Luby |
| 7,240,236 B2 | 7/2007 | Cutts et al. |
| 7,240,358 B2 | 7/2007 | Horn et al. |
| 7,243,285 B2 | 7/2007 | Foisy et al. |
| 7,249,291 B2 | 7/2007 | Rasmussen et al. |
| 7,254,754 B2 | 8/2007 | Hetzler et al. |
| 7,257,764 B2 | 8/2007 | Suzuki et al. |
| 7,265,688 B2 | 9/2007 | Shokrollahi et al. |
| 7,293,222 B2 | 11/2007 | Shokrollahi et al. |
| 7,295,573 B2 | 11/2007 | Yi et al. |
| 7,304,990 B2 | 12/2007 | Rajwan |
| 7,318,180 B2 | 1/2008 | Starr |
| 7,320,099 B2 | 1/2008 | Miura et al. |
| 7,363,048 B2 | 4/2008 | Cheng et al. |
| 7,391,717 B2 | 6/2008 | Klemets et al. |
| 7,394,407 B2 | 7/2008 | Shokrollahi et al. |
| 7,398,454 B2 | 7/2008 | Cai et al. |
| 7,409,626 B1 | 8/2008 | Schelstraete |
| 7,412,641 B2 | 8/2008 | Shokrollahi |
| 7,418,651 B2 | 8/2008 | Luby et al. |
| 7,451,377 B2 | 11/2008 | Shokrollahi |
| 7,483,447 B2 | 1/2009 | Chang et al. |
| 7,483,489 B2 | 1/2009 | Gentric et al. |
| 7,512,697 B2 | 3/2009 | Lassen et al. |
| 7,525,994 B2 | 4/2009 | Scholte |
| 7,529,806 B1 | 5/2009 | Shteyn |
| 7,532,132 B2 | 5/2009 | Shokrollahi et al. |
| 7,555,006 B2 | 6/2009 | Wolfe et al. |
| 7,559,004 B1 | 7/2009 | Chang et al. |
| 7,570,665 B2 | 8/2009 | Ertel et al. |
| 7,574,706 B2 | 8/2009 | Meulemans et al. |
| 7,590,118 B2 | 9/2009 | Giesberts et al. |
| 7,597,423 B2 | 10/2009 | Silverbrook |
| 7,613,183 B1 | 11/2009 | Brewer et al. |
| 7,633,413 B2 | 12/2009 | Shokrollahi et al. |
| 7,633,970 B2 | 12/2009 | Van Kampen et al. |
| 7,644,335 B2 | 1/2010 | Luby et al. |
| 7,650,036 B2 | 1/2010 | Lei et al. |
| 7,668,198 B2 | 2/2010 | Yi et al. |
| 7,676,735 B2 | 3/2010 | Luby et al. |
| 7,711,068 B2 | 5/2010 | Shokrollahi et al. |
| 7,720,096 B2 | 5/2010 | Klemets |
| 7,720,174 B2 | 5/2010 | Shokrollahi et al. |
| 7,721,184 B2 | 5/2010 | Luby et al. |
| 7,812,743 B2 | 10/2010 | Luby |
| 7,831,896 B2 | 11/2010 | Amram et al. |
| 7,924,913 B2 | 4/2011 | Sullivan et al. |
| 7,956,772 B2 | 6/2011 | Shokrollahi et al. |
| 7,961,700 B2 | 6/2011 | Malladi et al. |
| 7,971,129 B2 | 6/2011 | Watson et al. |
| 7,979,769 B2 | 7/2011 | Lee et al. |
| 8,027,328 B2 | 9/2011 | Yang et al. |
| 8,028,322 B2 | 9/2011 | Riedl et al. |
| 8,081,716 B2 | 12/2011 | Kang et al. |
| 8,135,073 B2 | 3/2012 | Shen |
| 8,185,794 B2 | 5/2012 | Lohmar et al. |
| 8,185,809 B2 | 5/2012 | Luby et al. |
| RE43,741 E | 10/2012 | Shokrollahi et al. |
| 8,301,725 B2 | 10/2012 | Biderman et al. |
| 8,327,403 B1 | 12/2012 | Chilvers et al. |
| 8,340,133 B2 | 12/2012 | Kim et al. |
| 8,422,474 B2 | 4/2013 | Park et al. |
| 8,462,643 B2 | 6/2013 | Walton et al. |
| 8,544,043 B2 | 9/2013 | Parekh et al. |
| 8,572,646 B2 | 10/2013 | Haberman et al. |
| 8,615,023 B2 | 12/2013 | Oh et al. |
| 8,638,796 B2 | 1/2014 | Dan et al. |
| 8,713,624 B1 | 4/2014 | Harvey et al. |
| 8,737,421 B2 | 5/2014 | Zhang et al. |
| 8,812,735 B2 | 8/2014 | Igarashi |
| 8,958,375 B2 | 2/2015 | Watson et al. |
| 2001/0015944 A1 | 8/2001 | Takahashi et al. |
| 2001/0033586 A1 | 10/2001 | Takashimizu et al. |
| 2002/0009137 A1 | 1/2002 | Nelson et al. |
| 2002/0053062 A1 | 5/2002 | Szymanski |
| 2002/0083345 A1 | 6/2002 | Halliday et al. |
| 2002/0085013 A1 | 7/2002 | Lippincott |
| 2002/0133247 A1 | 9/2002 | Smith et al. |
| 2002/0141433 A1 | 10/2002 | Kwon et al. |
| 2002/0143953 A1 | 10/2002 | Aiken |
| 2002/0191116 A1 | 12/2002 | Kessler et al. |
| 2003/0005386 A1 | 1/2003 | Bhatt et al. |
| 2003/0037299 A1 | 2/2003 | Smith |
| 2003/0086515 A1 | 5/2003 | Trans et al. |
| 2003/0101408 A1 | 5/2003 | Martinian et al. |
| 2003/0106014 A1 | 6/2003 | Dohmen et al. |
| 2003/0138043 A1 | 7/2003 | Hannuksela |
| 2003/0194211 A1 | 10/2003 | Abecassis |
| 2003/0207696 A1 | 11/2003 | Willenegger et al. |
| 2003/0224773 A1 | 12/2003 | Deeds |
| 2003/0235219 A1* | 12/2003 | Kapadia et al. ............... 370/535 |
| 2004/0015768 A1 | 1/2004 | Bordes et al. |
| 2004/0031054 A1 | 2/2004 | Dankworth et al. |
| 2004/0049793 A1 | 3/2004 | Chou |
| 2004/0081106 A1 | 4/2004 | Bruhn |
| 2004/0096110 A1 | 5/2004 | Yogeshwar et al. |
| 2004/0117716 A1 | 6/2004 | Shen |
| 2004/0151109 A1 | 8/2004 | Batra et al. |
| 2004/0162071 A1 | 8/2004 | Grilli et al. |
| 2004/0207548 A1 | 10/2004 | Kilbank |
| 2004/0240382 A1 | 12/2004 | Ido et al. |
| 2004/0255328 A1 | 12/2004 | Baldwin et al. |
| 2005/0018635 A1 | 1/2005 | Proctor, Jr. |
| 2005/0028067 A1 | 2/2005 | Weirauch |
| 2005/0041736 A1 | 2/2005 | Butler-Smith et al. |
| 2005/0071491 A1 | 3/2005 | Seo |
| 2005/0091697 A1 | 4/2005 | Tanaka et al. |
| 2005/0097213 A1 | 5/2005 | Barrett et al. |
| 2005/0105371 A1 | 5/2005 | Johnson et al. |
| 2005/0123058 A1 | 6/2005 | Greenbaum et al. |
| 2005/0138286 A1 | 6/2005 | Franklin et al. |
| 2005/0160272 A1 | 7/2005 | Teppler |
| 2005/0163468 A1 | 7/2005 | Takahashi et al. |
| 2005/0180415 A1 | 8/2005 | Cheung et al. |
| 2005/0193309 A1 | 9/2005 | Grilli et al. |
| 2005/0195752 A1 | 9/2005 | Amin et al. |
| 2005/0195899 A1 | 9/2005 | Han |
| 2005/0195900 A1 | 9/2005 | Han |
| 2005/0207392 A1 | 9/2005 | Sivalingham et al. |
| 2005/0216472 A1 | 9/2005 | Leon et al. |
| 2005/0216951 A1 | 9/2005 | MacInnis |
| 2005/0254575 A1 | 11/2005 | Hannuksela et al. |
| 2006/0015568 A1 | 1/2006 | Walsh et al. |
| 2006/0020796 A1 | 1/2006 | Aura et al. |
| 2006/0031738 A1 | 2/2006 | Fay et al. |
| 2006/0037037 A1 | 2/2006 | Xu |
| 2006/0048036 A1* | 3/2006 | Miura et al. ................... 714/758 |
| 2006/0093634 A1 | 5/2006 | Lutz et al. |
| 2006/0107174 A1 | 5/2006 | Heise |
| 2006/0109805 A1* | 5/2006 | Malamal Vadakital et al. ............................. 370/299 |
| 2006/0120464 A1 | 6/2006 | Hannuksela |
| 2006/0136797 A1* | 6/2006 | Cai et al. ........................ 714/752 |
| 2006/0193524 A1 | 8/2006 | Tarumoto et al. |
| 2006/0212444 A1 | 9/2006 | Handman et al. |
| 2006/0212782 A1 | 9/2006 | Li |
| 2006/0229075 A1 | 10/2006 | Kim et al. |
| 2006/0244824 A1 | 11/2006 | Debey |
| 2006/0244865 A1 | 11/2006 | Simon |
| 2006/0248195 A1 | 11/2006 | Toumura et al. |
| 2006/0256851 A1 | 11/2006 | Wang et al. |
| 2006/0279437 A1 | 12/2006 | Luby et al. |
| 2007/0002953 A1 | 1/2007 | Kusunoki |
| 2007/0006274 A1 | 1/2007 | Paila et al. |
| 2007/0016594 A1 | 1/2007 | Visharam et al. |
| 2007/0022215 A1 | 1/2007 | Singer et al. |
| 2007/0028099 A1 | 2/2007 | Entin et al. |
| 2007/0078876 A1 | 4/2007 | Hayashi et al. |
| 2007/0081562 A1 | 4/2007 | Ma |
| 2007/0110074 A1* | 5/2007 | Bradley et al. ............ 370/395.51 |
| 2007/0140369 A1 | 6/2007 | Limberg et al. |
| 2007/0162568 A1 | 7/2007 | Gupta et al. |

(56) References Cited

U.S. PATENT DOCUMENTS

| | | |
|---|---|---|
| 2007/0162611 A1 | 7/2007 | Yu et al. |
| 2007/0176800 A1 | 8/2007 | Rijavec |
| 2007/0177811 A1 | 8/2007 | Yang et al. |
| 2007/0185973 A1 | 8/2007 | Wayda et al. |
| 2007/0195894 A1 | 8/2007 | Shokrollahi et al. |
| 2007/0200949 A1 | 8/2007 | Walker et al. |
| 2007/0201549 A1 | 8/2007 | Hannuksela et al. |
| 2007/0230568 A1 | 10/2007 | Eleftheriadis et al. |
| 2007/0233784 A1 | 10/2007 | ORourke et al. |
| 2007/0255844 A1 | 11/2007 | Shen et al. |
| 2007/0277209 A1 | 11/2007 | Yousef |
| 2007/0300127 A1 | 12/2007 | Watson et al. |
| 2008/0010153 A1 | 1/2008 | Pugh-O'Connor et al. |
| 2008/0034273 A1 | 2/2008 | Luby |
| 2008/0052753 A1 | 2/2008 | Huang et al. |
| 2008/0058958 A1 | 3/2008 | Cheng |
| 2008/0059532 A1 | 3/2008 | Kazmi et al. |
| 2008/0066136 A1 | 3/2008 | Dorai et al. |
| 2008/0075172 A1 | 3/2008 | Koto |
| 2008/0086751 A1 | 4/2008 | Horn et al. |
| 2008/0101478 A1 | 5/2008 | Kusunoki |
| 2008/0134005 A1 | 6/2008 | Izzat et al. |
| 2008/0152241 A1 | 6/2008 | Itoi et al. |
| 2008/0170564 A1 | 7/2008 | Shi et al. |
| 2008/0170806 A1 | 7/2008 | Kim |
| 2008/0172430 A1 | 7/2008 | Thorstensen |
| 2008/0172712 A1 | 7/2008 | Munetsugu |
| 2008/0181296 A1 | 7/2008 | Tian et al. |
| 2008/0189419 A1 | 8/2008 | Girle et al. |
| 2008/0192818 A1 | 8/2008 | DiPietro et al. |
| 2008/0215317 A1 | 9/2008 | Fejzo |
| 2008/0232357 A1 | 9/2008 | Chen |
| 2008/0243918 A1 | 10/2008 | Holtman |
| 2008/0256418 A1 | 10/2008 | Luby et al. |
| 2008/0281943 A1 | 11/2008 | Shapiro |
| 2008/0285556 A1 | 11/2008 | Park et al. |
| 2008/0303893 A1 | 12/2008 | Kim et al. |
| 2008/0303896 A1 | 12/2008 | Lipton et al. |
| 2008/0309525 A1 | 12/2008 | Shokrollahi et al. |
| 2008/0313191 A1 | 12/2008 | Bouazizi |
| 2009/0003439 A1 | 1/2009 | Wang et al. |
| 2009/0019229 A1 | 1/2009 | Morrow et al. |
| 2009/0031199 A1 | 1/2009 | Luby et al. |
| 2009/0043906 A1 | 2/2009 | Hurst et al. |
| 2009/0055705 A1 | 2/2009 | Gao |
| 2009/0067551 A1 | 3/2009 | Chen et al. |
| 2009/0083806 A1 | 3/2009 | Barrett et al. |
| 2009/0089445 A1 | 4/2009 | Deshpande |
| 2009/0092138 A1 | 4/2009 | Joo et al. |
| 2009/0100496 A1 | 4/2009 | Bechtolsheim et al. |
| 2009/0103523 A1 | 4/2009 | Katis et al. |
| 2009/0106356 A1 | 4/2009 | Brase et al. |
| 2009/0125636 A1 | 5/2009 | Li et al. |
| 2009/0150557 A1 | 6/2009 | Wormley et al. |
| 2009/0158114 A1 | 6/2009 | Shokrollahi |
| 2009/0164653 A1 | 6/2009 | Mandyam et al. |
| 2009/0189792 A1 | 7/2009 | Shokrollahi et al. |
| 2009/0195640 A1 | 8/2009 | Kim et al. |
| 2009/0201990 A1 | 8/2009 | Leprovost et al. |
| 2009/0204877 A1 | 8/2009 | Betts |
| 2009/0210547 A1 | 8/2009 | Lassen et al. |
| 2009/0222873 A1 | 9/2009 | Einarsson |
| 2009/0248697 A1 | 10/2009 | Richardson et al. |
| 2009/0257508 A1 | 10/2009 | Aggarwal et al. |
| 2009/0287841 A1 | 11/2009 | Chapweske et al. |
| 2009/0297123 A1 | 12/2009 | Virdi et al. |
| 2009/0300203 A1 | 12/2009 | Virdi et al. |
| 2009/0300204 A1 | 12/2009 | Zhang et al. |
| 2009/0307565 A1 | 12/2009 | Luby et al. |
| 2009/0319563 A1 | 12/2009 | Schnell |
| 2009/0328228 A1 | 12/2009 | Schnell |
| 2010/0011061 A1 | 1/2010 | Hudson et al. |
| 2010/0011117 A1 | 1/2010 | Hristodorescu et al. |
| 2010/0011274 A1 | 1/2010 | Stockhammer et al. |
| 2010/0020871 A1 | 1/2010 | Hannuksela et al. |
| 2010/0023525 A1 | 1/2010 | Westerlund et al. |
| 2010/0046906 A1 | 2/2010 | Kanamori et al. |
| 2010/0049865 A1 | 2/2010 | Hannuksela et al. |
| 2010/0061444 A1 | 3/2010 | Wilkins et al. |
| 2010/0067495 A1 | 3/2010 | Lee et al. |
| 2010/0103001 A1 | 4/2010 | Shokrollahi et al. |
| 2010/0131671 A1 | 5/2010 | Kohli et al. |
| 2010/0153578 A1 | 6/2010 | Van et al. |
| 2010/0165077 A1 | 7/2010 | Yin et al. |
| 2010/0174823 A1 | 7/2010 | Huang |
| 2010/0189131 A1 | 7/2010 | Branam et al. |
| 2010/0198982 A1 | 8/2010 | Fernandez |
| 2010/0211690 A1 | 8/2010 | Pakzad et al. |
| 2010/0223533 A1 | 9/2010 | Stockhammer et al. |
| 2010/0235472 A1 | 9/2010 | Sood et al. |
| 2010/0235528 A1 | 9/2010 | Bocharov et al. |
| 2010/0257051 A1 | 10/2010 | Fernandez |
| 2010/0318632 A1 | 12/2010 | Yoo et al. |
| 2011/0019769 A1 | 1/2011 | Shokrollahi et al. |
| 2011/0055881 A1 | 3/2011 | Yu et al. |
| 2011/0083144 A1 | 4/2011 | Bocharov et al. |
| 2011/0096828 A1 | 4/2011 | Chen et al. |
| 2011/0103519 A1 | 5/2011 | Shokrollahi et al. |
| 2011/0119394 A1 | 5/2011 | Wang et al. |
| 2011/0119396 A1 | 5/2011 | Kwon et al. |
| 2011/0216541 A1 | 9/2011 | Inoue et al. |
| 2011/0231519 A1 | 9/2011 | Luby et al. |
| 2011/0231569 A1 | 9/2011 | Luby et al. |
| 2011/0238789 A1 | 9/2011 | Luby et al. |
| 2011/0239078 A1 | 9/2011 | Luby et al. |
| 2011/0258510 A1 | 10/2011 | Watson et al. |
| 2011/0268178 A1 | 11/2011 | Park et al. |
| 2011/0280311 A1 | 11/2011 | Chen et al. |
| 2011/0280316 A1 | 11/2011 | Chen et al. |
| 2011/0299629 A1 | 12/2011 | Luby et al. |
| 2011/0307545 A1 | 12/2011 | Bouazizi |
| 2011/0307581 A1 | 12/2011 | Furbeck et al. |
| 2012/0013746 A1 | 1/2012 | Chen et al. |
| 2012/0016965 A1 | 1/2012 | Chen et al. |
| 2012/0020413 A1 | 1/2012 | Chen et al. |
| 2012/0023249 A1 | 1/2012 | Chen et al. |
| 2012/0023254 A1 | 1/2012 | Park et al. |
| 2012/0033730 A1 | 2/2012 | Lee |
| 2012/0042050 A1 | 2/2012 | Chen et al. |
| 2012/0042089 A1 | 2/2012 | Chen et al. |
| 2012/0047280 A1 | 2/2012 | Park et al. |
| 2012/0099593 A1 | 4/2012 | Luby |
| 2012/0151302 A1 | 6/2012 | Luby et al. |
| 2012/0185530 A1 | 7/2012 | Reza |
| 2012/0202535 A1 | 8/2012 | Chaddha et al. |
| 2012/0207068 A1 | 8/2012 | Watson et al. |
| 2012/0208580 A1 | 8/2012 | Luby et al. |
| 2012/0210190 A1 | 8/2012 | Luby et al. |
| 2012/0317305 A1 | 12/2012 | Einarsson et al. |
| 2013/0002483 A1 | 1/2013 | Rowitch et al. |
| 2013/0007223 A1 | 1/2013 | Luby et al. |
| 2013/0067295 A1 | 3/2013 | Luby et al. |
| 2013/0091251 A1 | 4/2013 | Walker et al. |
| 2013/0246643 A1 | 9/2013 | Luby et al. |
| 2013/0254634 A1 | 9/2013 | Luby |
| 2013/0287023 A1 | 10/2013 | Bims |
| 2014/0009578 A1 | 1/2014 | Chen et al. |
| 2014/0380113 A1 | 12/2014 | Luby |

FOREIGN PATENT DOCUMENTS

| | | |
|---|---|---|
| CN | 1481643 A | 3/2004 |
| CN | 1708934 A | 12/2005 |
| CN | 1714577 A | 12/2005 |
| CN | 1792056 A | 6/2006 |
| CN | 1806392 A | 7/2006 |
| CN | 1819661 A | 8/2006 |
| CN | 101390399 A | 3/2009 |
| CN | 101729857 A | 6/2010 |
| EP | 0669587 A2 | 8/1995 |
| EP | 0701371 A1 | 3/1996 |
| EP | 0784401 A2 | 7/1997 |
| EP | 0853433 A1 | 7/1998 |
| EP | 0854650 A2 | 7/1998 |

(56) References Cited

FOREIGN PATENT DOCUMENTS

| | | |
|---|---|---|
| EP | 0903955 A1 | 3/1999 |
| EP | 0986908 A1 | 3/2000 |
| EP | 1024672 A1 | 8/2000 |
| EP | 1051027 A1 | 11/2000 |
| EP | 1124344 A1 | 8/2001 |
| EP | 1298931 A2 | 4/2003 |
| EP | 1406452 A2 | 4/2004 |
| EP | 1455504 A2 | 9/2004 |
| EP | 1468497 A1 | 10/2004 |
| EP | 1501318 A1 | 1/2005 |
| EP | 1670256 A2 | 6/2006 |
| EP | 1755248 A1 | 2/2007 |
| EP | 2071827 A2 | 6/2009 |
| EP | 1241795 A2 | 8/2009 |
| EP | 2096870 A2 | 9/2009 |
| EP | 1700410 B1 | 4/2010 |
| JP | H07183873 | 7/1995 |
| JP | 08186570 | 7/1996 |
| JP | 8289255 A | 11/1996 |
| JP | 9252253 A | 9/1997 |
| JP | 11041211 A | 2/1999 |
| JP | 11112479 | 4/1999 |
| JP | 11164270 A | 6/1999 |
| JP | 2000151426 A | 5/2000 |
| JP | 2000216835 A | 8/2000 |
| JP | 2000513164 A | 10/2000 |
| JP | 2000307435 A | 11/2000 |
| JP | 2000353969 A | 12/2000 |
| JP | 2001036417 | 2/2001 |
| JP | 2001094625 | 4/2001 |
| JP | 2001223655 A | 8/2001 |
| JP | 2001251287 A | 9/2001 |
| JP | 2001274776 A | 10/2001 |
| JP | 2001274855 A | 10/2001 |
| JP | 2002073625 A | 3/2002 |
| JP | 2002204219 A | 7/2002 |
| JP | 2002543705 A | 12/2002 |
| JP | 2003507985 | 2/2003 |
| JP | 2003092564 A | 3/2003 |
| JP | 2003510734 A | 3/2003 |
| JP | 2003174489 | 6/2003 |
| JP | 2003256321 A | 9/2003 |
| JP | 2003318975 A | 11/2003 |
| JP | 2003319012 | 11/2003 |
| JP | 2003333577 A | 11/2003 |
| JP | 2004048704 A | 2/2004 |
| JP | 2004070712 A | 3/2004 |
| JP | 2004135013 A | 4/2004 |
| JP | 2004165922 A | 6/2004 |
| JP | 2004516717 A | 6/2004 |
| JP | 2004192140 A | 7/2004 |
| JP | 2004193992 A | 7/2004 |
| JP | 2004529533 A | 9/2004 |
| JP | 2004289621 A | 10/2004 |
| JP | 2004343701 A | 12/2004 |
| JP | 2004348824 A | 12/2004 |
| JP | 2004362099 A | 12/2004 |
| JP | 2005094140 A | 4/2005 |
| JP | 2005136546 A | 5/2005 |
| JP | 2005514828 T | 5/2005 |
| JP | 2005204170 A | 7/2005 |
| JP | 2005223433 A | 8/2005 |
| JP | 2005277950 A | 10/2005 |
| JP | 2006503463 A | 1/2006 |
| JP | 2006505177 A | 2/2006 |
| JP | 2006506926 A | 2/2006 |
| JP | 2006074335 A | 3/2006 |
| JP | 2006074421 A | 3/2006 |
| JP | 2006115104 A | 4/2006 |
| JP | 3809957 | 6/2006 |
| JP | 2006174032 A | 6/2006 |
| JP | 2006174045 A | 6/2006 |
| JP | 2006186419 A | 7/2006 |
| JP | 2006519517 A | 8/2006 |
| JP | 2006287422 A | 10/2006 |
| JP | 2006319743 A | 11/2006 |
| JP | 2007013675 A | 1/2007 |
| JP | 2007089137 A | 4/2007 |
| JP | 3976163 | 6/2007 |
| JP | 2007158592 A | 6/2007 |
| JP | 2007174170 A | 7/2007 |
| JP | 2007520961 A | 7/2007 |
| JP | 2007228205 A | 9/2007 |
| JP | 2008011404 A | 1/2008 |
| JP | 2008016907 A | 1/2008 |
| JP | 2008508761 A | 3/2008 |
| JP | 2008508762 A | 3/2008 |
| JP | 2008283232 A | 11/2008 |
| JP | 2008283571 A | 11/2008 |
| JP | 2008543142 A | 11/2008 |
| JP | 2008546361 A | 12/2008 |
| JP | 2009027598 A | 2/2009 |
| JP | 2009522921 A | 6/2009 |
| JP | 2009522922 A | 6/2009 |
| JP | 2009171558 A | 7/2009 |
| JP | 2009527949 A | 7/2009 |
| JP | 2009277182 A | 11/2009 |
| JP | 2009544991 A | 12/2009 |
| JP | 2010539832 A | 12/2010 |
| JP | 2008502212 | 1/2011 |
| JP | 2001189665 A | 2/2011 |
| JP | 2011087103 A | 4/2011 |
| KR | 1020030071815 | 9/2003 |
| KR | 1020030074386 A | 9/2003 |
| KR | 20040107152 A | 12/2004 |
| KR | 20040107401 A | 12/2004 |
| KR | 20050009376 A | 1/2005 |
| KR | 100809086 B1 | 3/2008 |
| KR | 20080083299 A | 9/2008 |
| KR | 20090098919 A | 9/2009 |
| RU | 99117925 A | 7/2001 |
| RU | 2189629 C2 | 9/2002 |
| RU | 2265960 C2 | 12/2005 |
| RU | 2290768 C1 | 12/2006 |
| RU | 2297663 C2 | 4/2007 |
| RU | 2312390 C2 | 12/2007 |
| RU | 2357279 C2 | 5/2009 |
| TW | I246841 B | 1/2006 |
| TW | I354908 | 12/2011 |
| TW | I355168 | 12/2011 |
| WO | WO9634463 A1 | 10/1996 |
| WO | WO-9750183 A1 | 12/1997 |
| WO | WO9804973 A1 | 2/1998 |
| WO | WO9832231 | 7/1998 |
| WO | WO-9832256 A1 | 7/1998 |
| WO | WO0014921 A1 | 3/2000 |
| WO | WO0018017 | 3/2000 |
| WO | WO0052600 A1 | 9/2000 |
| WO | WO0120786 A1 | 3/2001 |
| WO | WO0157667 A1 | 8/2001 |
| WO | WO0158130 A2 | 8/2001 |
| WO | WO0158131 A2 | 8/2001 |
| WO | WO0227988 A2 | 4/2002 |
| WO | WO02047391 | 6/2002 |
| WO | 02063461 A1 | 8/2002 |
| WO | WO-03046742 A1 | 6/2003 |
| WO | WO03056703 | 7/2003 |
| WO | WO03105350 | 12/2003 |
| WO | WO-03105484 A1 | 12/2003 |
| WO | WO2004015948 A1 | 2/2004 |
| WO | WO2004019521 A1 | 3/2004 |
| WO | WO2004030273 A1 | 4/2004 |
| WO | WO2004034589 A2 | 4/2004 |
| WO | WO-2004036824 A1 | 4/2004 |
| WO | WO2004040831 A1 | 5/2004 |
| WO | WO-2004047019 A2 | 6/2004 |
| WO | WO2004047455 A1 | 6/2004 |
| WO | WO-2004088988 A1 | 10/2004 |
| WO | WO-2004109538 A1 | 12/2004 |
| WO | WO2005036753 A2 | 4/2005 |
| WO | WO2005041421 A1 | 5/2005 |
| WO | WO2005078982 A1 | 8/2005 |
| WO | WO-2005107123 | 11/2005 |
| WO | WO2005112250 A2 | 11/2005 |

(56) References Cited

FOREIGN PATENT DOCUMENTS

| WO | WO-2006013459 A1 | 2/2006 |
|---|---|---|
| WO | WO2006020826 A2 | 2/2006 |
| WO | WO-2006036276 | 4/2006 |
| WO | 2006060036 A1 | 6/2006 |
| WO | WO-2006057938 A2 | 6/2006 |
| WO | WO2006084503 A1 | 8/2006 |
| WO | WO-2006116102 A2 | 11/2006 |
| WO | WO-2006135878 A2 | 12/2006 |
| WO | 2007078253 A2 | 7/2007 |
| WO | WO2007090834 A2 | 8/2007 |
| WO | WO-2007098397 A2 | 8/2007 |
| WO | WO-2007098480 A1 | 8/2007 |
| WO | 2008011549 A2 | 1/2008 |
| WO | WO-2008023328 A3 | 4/2008 |
| WO | WO2008054100 A1 | 5/2008 |
| WO | 2008086313 A1 | 7/2008 |
| WO | WO2008085013 A1 | 7/2008 |
| WO | WO-2008131023 A1 | 10/2008 |
| WO | 2008144004 A1 | 11/2008 |
| WO | WO-2009065526 A1 | 5/2009 |
| WO | WO-2009137705 A2 | 11/2009 |
| WO | 2009143741 A1 | 12/2009 |
| WO | WO2010085361 A2 | 7/2010 |
| WO | WO2010088420 A1 | 8/2010 |
| WO | WO2010120804 A1 | 10/2010 |
| WO | WO-2011038013 | 3/2011 |
| WO | WO-2011038034 A1 | 3/2011 |
| WO | 2011059286 A2 | 5/2011 |
| WO | 2011070552 A1 | 6/2011 |
| WO | 2011102792 A1 | 8/2011 |
| WO | WO-2012021540 | 2/2012 |
| WO | WO-2012109614 A1 | 8/2012 |

OTHER PUBLICATIONS

International Preliminary Report on Patentability, PCT/US2007/062086—The International Bureau of WIPO—Geneva, Switzerland, Aug. 19, 2008.

Written Opinion, PCT/US2007/062086—International Search Authority—European Patent Office, Nov. 1, 2007.

Bross, et al., "High efficiency video coding (HEVC) text specification draft 6," Joint Collaborative Team on Video Coding (JCT-VC) of ITU-T SG16 WP3 and ISO/IEC JTC1/SC29/WG11 JCTVC-H1003, 7th Meeting: Geneva, CH, Nov. 21-30, 2011, pp. 259.

Bross, et al., "High efficiency video coding (HEVC) text specification draft 7," Joint Collaborative Team on Video Coding (JCT-VC) of ITU-T SG16 WP3 and ISO/IEC JTC1/SC29/WG11 9th Meeting: Geneva, CH, Apr. 27-May 7, 2012, JCTVC-I1003_d21, pp. 290.

Bross, et al., "High efficiency video coding (HEVC) text specification draft 8," Joint Collaborative Team on Video Coding (JCT-VC) of ITU-T SG16 WP3 and ISO/IEC JTC1/SC29/WG11 10th Meeting: Stockholm, SE, Jul. 11-20, 2012, JCTVC-J1003_d7, pp. 261.

Bross et al., "WD4: Working Draft 4 of High-Efficiency Video Coding," JCTVC-F803_d2, (JCT-VC) of ITU-T SG16 WP3 and ISO/IEC JTC1/SC29/WG11 Joint Collaborative Team on Video Coding, 6th Meeting, Torino, IT, Jul. 14-22, 2011, 226 pages.

Bross et al., "WD5: Working Draft 5 of High-Efficiency Video Coding," JCTVC-G1103_d2, (JCT-VC) of ITU-T SG16 WP3 and ISO/IEC JTC1/SC29/WG11 Joint Collaborative Team on Video Coding, 7th Meeting, Geneva, Switzerland (Nov. 2011), 214 pages.

European Search Report—EP10013235—Search Authority—The Hague—Aug. 20, 2012.

ITU-T H.264, Series H: Audiovisual and Multimedia Systems, Infrastructure of audiovisual services_Coding of moving video, Advanced video coding for generic audiovisual services, The International Telecommunication Union. Jun. 2011, 674 pp.

Jiang., File Format for Scalable Video Coding, PowerPoint Presentation for CMPT 820, Summer 2008.

Pantos, "HTTP Live Streaming draft-pantos-http-live-streaming-02", Informational, Internet-Draft, Intended status: Informational, Expires: Apr. 8, 2010, http://tools.ietf.org/html/draft-pantos-http-live-streaming-02, pp. 1-20, Oct. 5, 2009.

Thomas Wiegand et al.,"WD1: Working Draft 1 of High-Efficiency Video Coding", JCTVC-C403, Joint Collaborative Team on Video Coding (JCT-VC), of ITU-T SG16 WP3 and ISO/IEC JTC1/SC29/WG11, 3rd Meeting: Guangzhou, CN, Oct. 7-15, 2010.

Wiegand et al., "WD3: Working Draft 3 of High-Efficiency Video Coding," Document JCTVC-E603, 5th Meeting: Geneva, CH, Mar. 16-23, 2011, 193 pp.

Wiegand T. et al., "WD2: Working Draft 2 of High-Efficiency Video Coding", 20110128, No. JCTVC-D503, Jan. 28, 2011, XP002679642, Retrieved from the Internet: URL: http://wftp3.itu.int/av-arch/jctvc-site/2011_01_D_Daegu/ [retrieved on Jul. 11, 2012].

Yamanouchi N., et al., "Internet Multimedia Transmission with Packet by Using Forward Error Correction," Proceedings of DPS Workshop, The Information Processing Society of Japan, Dec. 6, 2000, vol. 2000, No. 15, pp. 145-150.

3GPP TS 26.234 V9.1.0 ,"3rd Generation Partnership Project; Technical Specification Group Services and System Aspects; Transparent end-to-end Packet-switched Streaming Service (PSS); Protocols and codecs (Release 9)", Dec. 2009, 179 pages.

3GPP TS 26.244 V9.1.0, 3rd Generation Partnership Project; Technical Specification Group Services and System Aspects; Transparent end-to-end packet switched streaming service (PSS); 3GPP file format (3GP), (Release 9), Mar. 2010, 55 pp.

3GPP TS 26.247, v1.5.0, 3rd Generation Partnership Project; Technical Specification Group Services and System Aspects Transparent end-to-end Packet-switched Streaming Service (PSS); Progressive Download and Dynamic Adaptive Streaming over HTTP (3GP-DASH) (Release 10), 2010, 91 pages.

3rd Generation Partnership Project, Technical Specification Group Services and System Aspects Transparent end-to-end packet switched streaming service (PSS); 3GPP file format (3GP) (Release 9 ) , 3GPP Standard, 3GPP TS 26.244, 3rd Generation Partnership Project (3GPP), Mobile Competence Centre , 650, Route Des Lucioles , F-06921 Sophia-Antipolis Cedex , France, No. V8.1.0, Jun. 1, 2009, pp. 1-52, XP050370199.

3rd Generation Partnership Project; Technical Specification Group Services and System Aspects; Transparent end-to-end packet switched streaming service (PSS); 3GPP file format (3GP) (Release 9), 3GPP Standard; 3GPP TS 26.244, 3rd Generation Partnership Project (3GPP), Mobile Competence Centre; 650, Route Des Lucioles; F-06921 Sophia-Antipolis Cedex; France, No. V9.2.0, Jun. 9, 2010, pp. 1-55, XP050441544, [retrieved on Jun. 9, 2010].

Aggarwal, C. et al.: "A Permutation-Based Pyramid Broadcasting Scheme for Video-on-Demand Systems," Proc. IEEE Int'l Conf. on Multimedia Systems, Hiroshima, Japan (Jun. 1996).

Aggarwal, C. et al.: "On Optimal Batching Policies for Video-on-Demand Storage Servers," Multimedia Systems, vol. 4, No. 4, pp. 253-258 (1996).

Albanese, A., et al., "Priority Encoding Transmission", IEEE Transactions on Information Theory, vol. 42, No. 6, pp. 1-22, (Nov. 1996).

Alex Zambelli,"IIS Smooth Streaming Technical Overview", Microsoft Mar. 25, 2009, XP002620446, Retrieved from the Internet: URL:http://www.microsoft.com/downloads/en/ details. aspx"FamilyID=03d22583-3ed6-44da-8464-blb4b5ca7520, [retrieved on Jan. 21, 2011].

Almeroth, et al., "The use of multicast delivery to provide a scalable and interactive video-on-demand service", IEEE Journal on Selected Areas in Communication, 14(6): 1110-1122, (1996).

Alon, et al.: "Linear Time Erasure Codes with Nearly Optimal Recovery," Proceedings of the Annual Symposium on Foundations of Computer Science, US, Los Alamitos, IEEE Comp. Soc. Press, vol. Symp. 36, pp. 512-516 (Oct. 23, 1995) XP000557871.

Amin Shokrollahi: "LDPC Codes: An Introduction" Internet Citation 2 Apr. 1, 2003 (Apr. 2, 2003), XP002360065 Retrieved from the Internet: URL : http ://www . ipm. ac . ir/IPM/homepage/Amin 2. pdf [retrieved on Dec. 19, 2005].

Amon P et al., "File Format for Scalable Video Coding", IEEE Transactions on Circuits and Systems for Video Technology, IEEE

(56) References Cited

OTHER PUBLICATIONS

Service Center, Piscataway, NJ, US, vol. 17, No. 9, Sep. 1, 2007, pp. 1174-1185, XP011193013, ISSN: 1051-8215, DOI:10.1109/TCSVT.2007.905521.
Anonymous: [Gruneberg, K., Narasimhan, S. and Chen, Y., editors] "Text of ISO/IEC 13818-1:2007/PDAM 6 MVC operation point descriptor", 90 MPEG Meeting; Oct. 26, 2009-Oct. 30, 2009; Xian; (Motion Picture Expertgroup or ISO/IEC JTC1/SC29/WG11), No. N10942, Nov. 19, 2009, XP030017441.
Anonymous: "Text of ISO/IEC 14496-12 3rd Edition", 83 MPEG Meeting; Jan. 14, 2008-Jan. 18, 2008; Antalya; (Motion Pictureexpert Group or ISO/IEC JTC1/SC29/WG11), No. N9678, Apr. 22, 2008, XP030016172.
Anonymous: "Text of ISO/IEC 14496-15 2nd edition", 91 MPEG Meeting; Jan. 18, 2010-Jan. 22, 2010; Kyoto; (Motion Picture Expertgroup or ISO/IEC JTC1/SC29/WG11),, No. N11139, Jan. 22, 2010, XP030017636.
Bar-Noy, et al., "Competitive on-line stream merging algorithms for media-on-demand", Draft (Jul. 2000), pp. 1-34.
Bar-Noy et al. "Efficient algorithms for optimal stream merging for media-on-demand," Draft (Aug. 2000), pp. 1-43.
Bigloo, A. et al.: "A Robust Rate-Adaptive Hybrid ARQ Scheme and Frequency Hopping for Multiple-Access Communication Systems," IEEE Journal on Selected Areas in Communications, US, IEEE Inc, New York (Jun. 1, 1994) pp. 889-893, XP000464977.
Bitner, J.R., et al.: "Efficient Generation of the Binary Reflected Gray code and Its Applications," Communications of the ACM, pp. 517-521, vol. 19 (9), 1976.
Blomer, et al., "An XOR-Based Erasure-Resilient Coding Scheme," ICSI Technical Report No. TR-95-048 (1995) [avail. At ftp://ftp.icsi.berkeley.edu/pub/techreports/1995/tr-95-048.pdf].
Byers, J.W. et al.: "A Digital Fountain Approach to Reliable Distribution of Bulk Data," Computer Communication Review, Association for Computing Machinery. New York, US, vol. 28, No. 4 (Oct. 1998) pp. 56-67 XP000914424 ISSN:0146-4833.
Byers, J.W. et al.: "Accessing multiple mirror sites in parallel: using Tornado codes to speed up downloads," 1999, Eighteenth Annual Joint Conference of the IEEE Comupter and Communications Socities, pp. 275-283, Mar. 21, 1999, XP000868811.
Cataldi et al., "Sliding-Window Raptor Codes for Efficient Scalable Wireless Video Broadcasting With Unequal Loss Protection", IEEE Transactions on Image Processing, Jun. 1, 2010, pp. 1491-1503, vol. 19, No. 6, IEEE Service Center, XP011328559, ISSN: 1057-7149, DOI: 10.1109/TIP.2010.2042985.
Charles Lee L.H, "Error-Control Block Codes for Communications Engineers", 2000, Artech House, XP002642221 pp. 39-45.
Chen, et al., U.S. Patent Application titled "Frame Packing for Asymmetric Stereo Video", filed Feb. 25, 2011.
Chen, et al., U.S. Patent Application titled "One-Stream Coding for Asymmetric Stereo Video", filed Feb. 25, 2011.
Chen Ying et al., "Coding techniques in Multiview Video Coding and Joint Multiview Video Model", Picture Coding Symposium, 2009, PCS 2009, IEEE, Piscataway, NJ, USA, May 6, 2009, pp. 1-4, XP031491747, ISBN: 978-1-4244-4593-6.
Choi S: "Temporally enhanced erasure codes for reliable communication protocols" Computer Networks, Elsevier Science Publishers B.V., Amsterdam, NL, vol. 38, No. 6, Apr. 22, 2002, pp. 713-730, XP004345778, ISSN: 1389-1286, DOI:10.1016/S1389-1286(01)00280-8.
Clark G.C., et al., "Error Correction Coding for Digital Communications, System Applications," Error Correction Coding for Digital Communications, New York, Plenum Press, US, Jan. 1, 1981, pp. 339-341.
D. Gozalvez et,al. "AL-FEC for Improved Mobile Reception of MPEG-2 DVB-Transport Streams" Hindawi Publishing Corporation, International Journal of Digital Multimedia Broadcasting vol. 2009, Dec. 31, 2009, pp. 1-10, XP002582035 Retrieved from the Internet: URL:http://www.hindawi.com/journals/ijdmb/2009/614178.html> [retrieved on May 12, 2010].
Dan, A. et al.: "Scheduling Policies for an On-Demand Video Server with Batching," Proc. ACM Multimedia, pp. 15-23 (Oct. 1998).
Davey, M.C. et al.: "Low Density Parity Check Codes over GF(q)" IEEE Communications Letters, vol. 2, No. 6 pp. 165-167 (1998).
Digital Fountain: "Specification Text for Raptor Forward Error Correction," TDOC S4-050249 of 3GPP TSG SA WG 4 Meeting #34 [Online] (Feb. 25, 2005) pp. 1-23, XP002425167, Retrieved from the Internet: URL:http://www.3gpp.org/ftp/tsg_sa/WG4_CODEC/TSGS4_34/Docs.
Digital Fountain: "Raptor code specification for MBMS file download," 3GPP SA4 PSM AD-HOC #31 (May 21, 2004) XP002355055 pp. 1-6.
"Digital Video Broadcasting (DVB); Guidelines for the implementation of DVB-IP Phase 1 specifications; ETSI TS 102 542" ETSI Standards, LIS, Sophia Antipoliscedex, France, vol. BC, No. V1.2.1, Apr. 1, 2008, XP014041619 ISSN: 0000-0001 p. 43 p. 66 pp. 70, 71.
DVB-IPI Standard: DVB BlueBook A086r4 (Mar. 2007) Transport of MPEG 2 Transport Streatm (TS) Based DVB Services over IP Based Networks, ETSI Technical Specification 102 034 v1.3.1.
Eager, et al. "Minimizing bandwidth requirements for on-demand data delivery," Proceedings of the International Workshop on Advances in Multimedia Information Systems,p. 80-87 (Indian Wells, CA Oct. 1999).
Eager, et al., "Optimal and efficient merging schedules for video-on-demand servers", Proc. ACM Multimedia, vol. 7, pp. 199-202 (1999).
Esaki, et al.: "Reliable IP Multicast Communication Over ATM Networks Using Forward Error Correction Policy," IEICE Transactions on Communications, JP, Institute of Electronics Information and Comm. ENG. Tokyo, vol. E78-V, No. 12, (Dec. 1995), pp. 1622-1637, XP000556183.
Feng, G., Error Correcting Codes over Z2m for Algorithm-Based Fault-Tolerance, IEEE Transactions on Computers, vol. 43, No. 3, Mar. 1994, pp. 370-374.
Fernando, et al., "httpstreaming of MPEG Media—Response to CfP", 93 MPEG Meeting; Jul. 26, 2010-Jul. 30, 2010; Geneva; (Motion Picture Expert Group or ISO/IEC JTC1/SCE29/WG11), No. M17756, Jul. 22, 2010, XP030046346.
Fielding et al., "RFC 2616: Hypertext Transfer Protocol HTTP/1.1", Internet Citation, Jun. 1999, pp. 165, XP002196143, Retrieved from the Internet: URL:http://www.rfc-editor-org/ [retrieved on Apr. 15, 2002].
Gao, L. et al.: "Efficient Schemes for Broadcasting Popular Videos," Proc. Inter. Workshop on Network and Operating System Support for Digital Audio and Video, pp. 1-13 (1998).
Gasiba, Tiago et al., "System Design and Advanced Receiver Techniques for MBMS Broadcast Services" Proc. 2006 International Conference on Communications (ICC 2006), Jun. 1, 2006, pp. 5444-5450, XP031025781 ISBN: 978-1-4244-0354-7.
Gemmell, et al., "A Scalable Multicast Architecture for One-To-Many Telepresentations", Multimedia Computing and Systems, 1998/Proceedings. IEEE International Conference on Austin, TX, USA Jun. 28-Jul. 1, 1998, Los Alamitos, CA USA, IEEE Comput. Soc, US, Jun. 28, 1998, pp. 128-139, XP010291559.
Goyal: "Multiple Description Coding: Compression Meets the Network," in Signal Processing Magazine, IEEE, vol. 18., Issue 5 (Sep. 2001) pp. 74-93 URL:http://www.rle.mit.edu/stir/documents/Goyal_SigProcMag2001_MD.pdf [Nov. 4, 2007].
Gozalvez D et, al: "Mobile reception of DVB-T services by means of AL-FEC protection" Proc. IEEE Intern. Symposium on Broadband Multimedia Systems and Broadcasting (BMSB '09), IEEE, Piscataway, NJ, USA, May 13, 2009, pp. 1-5, XP031480155 ISBN: 978-1-4244-2590-7.
Gracie et al., "Turbo and Turbo-Like Codes: Principles and Applications in Telecommunications", Proceedings of the IEEE, Jun. 1, 2007, pp. 1228-1254, vol. 95, No. 6, IEEE, XP011189323, ISSN: 0018-9219, DOI: 10.1109/JPROC.2007.895197.
Grineberg, et al., "Deliverable D3.2 MVC/SVC storage format" Jan. 29, 2009, XP002599508 Retrieved from the Internet: URL:http://www.ist-sea.eu/Public/SEA_D3.2_HHI    FF_20090129.pdf [retrieved on Sep. 1, 2010] paragraph [02.3].
Hagenauer, J. : "Soft is better than hard" Communications, Coding and Cryptology, Kluwer Publication May 1994, XP002606615

(56) References Cited

OTHER PUBLICATIONS

Retrieved from the Internet : URL: http://www. Int . ei .turn. de/veroeffentlic hungen/l994/ccc94h. pdf [retrieved on Oct. 25, 2010].
He Wenge et al., "Asymmetric Stereoscopic Video Encoding Algorithm Based on Joint Compensation Prediction", IEEE International Conference on Communications and Mobile Computing, Jan. 6, 2009, pp. 191-194, XP031434775, ISBN: 978-0-7695-3501-2.
Hershey, et al., "Random Parity Coding (RPC)", 1996 IEEE International Conference on Communications (ICC). Converging Technologies for Tomorrow's Applications. Dallas, Jun. 23-27, 1996, IEEE International Conference on Communications (ICC), New York, IEEE, US, vol. 1, Jun. 23, 1996, pp. 122-126, XP000625654.
Hitachi Ltd. et al., "High-Definition Multimedia Interface," Specification Version 1.4, Jun. 5, 2009, 425 pp.
Hua, et al., "Skyscraper broadcasting: A new broadcasting system for metropolitan video-on-demand systems", Proc. ACM SIGCOMM, pp. 89-100 (Cannes, France, 1997).
Huawei et al., "Implict mapping between CCE and PUCCH for ACK/NACK TDD", 3GPP DRAFT; R1-082359, 3rd Generation Partnership Project (3GPP), Mobile Competence Centre; 650, Route Des Lucioles ; F-06921 Sophia-Antipolis Cedex ; France, vol. RAN WG1, No. Warsaw, Poland, Jun. 24, 2008, XP050110650, [retrieved on Jun. 24, 2008].
Ian Trow, "Is 3D Event Coverage Using Existing Broadcast Infrastructure Technically Possible", International Broadcasting Conference, Sep. 9, 2009-Sep. 13, 2009, XP030081671, pp. 4-5, "3D transmission over broadcast infrastructure" pp. 7-8, "Screen signaling"—Conclusions on 3D systems.
IETF RFC 2733: Rosenberg, J. et al. "An RTP Payload Format for Generic Forward Error Correction," Network Working Group, RFC 2733 (Dec. 1999).
International Search Report and Written Opinion—PCT/US2012/024737—ISA/EPO—May 11, 2012.
International Standard ISO/IEC 14496-12, Information Technology—Coding of audio-visual objects—Part 12: ISO base media file format, Third Edition, Oct. 15, 2008, 120 pp.
International Telecommunication Union, "ITU-T H.264, Series H: Audiovisual and Multimedia Systems, Infrastructure of audiovisual services—Coding of moving video, Advanced video coding for generic audiovisual services," Mar. 2010, 669 pp.
ISO/IEC JTC 1/SC 29, ISO/IEC FCD 23001-6, Information technology—MPEG systems technologies—Part 6: Dynamic adaptive streaming over HTTP (DASH), Jan. 28, 2011.
Jin Li, "The Efficient Implementation of Reed-Solomon High Rate Erasure Resilient Codes" Proc. 2005 IEEE International Conference on Acoustics, Speech, and Signal Processing, Philadelphia, PA, USA, IEEE, Piscataway, NJ, vol. 3, Mar. 18, 2005, pp. 1097-1100, XP010792442, DOI: 10.1109/ICASSP.2005.1415905 ISBN: 978-0-7803-8874-1.
Juhn, L. et al.: "Adaptive Fast Data Broadcasting Scheme for Video-on-Demand Service," IEEE Transactions on Broadcasting, vol. 44, No. 2, pp. 182-185 (Jun. 1998).
Juhn, L. et al.: "Harmonic Broadcasting for Video-on-Demand Service," IEEE Transactions on Broadcasting, vol. 43, No. 3, pp. 268-271 (Sep. 1997).
Kallel, "Complementary Punctured Convolutional (CPC) Codes and Their Applications", IEEE Transactions on Communications, IEEE Inc., New York, US, vol. 43, No. 6, Jun. 1, 1995, pp. 2005-2009.
Kimata H et al., "Inter-View Prediction With Downsampled Reference Pictures", ITU Study Group 16—Video Coding Experts Group—ISO/IEC MPEG & ITU-T VCEG(ISO/IEC JTC1/SC29/WG11 and ITU-T SG16 Q6), No. JVT-W079, Apr. 19, 2007, XP030007039.
Kimura et al., "A Highly Mobile SDM-0FDM System Using Reduced-Complexity-and-Latency Processing", IEEE International Symposium on Personal, Indoor and Mobile Radio Communications (PIMRC), Sep. 1, 2007, pp. 1-5, IEEE, XP031168836, ISBN: 978-1-4244-1143-6, DOI: 10.1109/PIMRC.2007.4394758.

Kozamernik F: "Media streaming over the Internet", Internet Citation, Oct. 2002, XP002266291, Retrieved from the Internet: URL: http://www.ebu.ch/trev_292-kozamerni k. pdf [retrieved on Jan. 8, 2004] section "Video codecs for scalable streaming".
Lee L., et al.,"VLSI implementation for low density parity check decoder", Proceedings of the 8th IEEE International Conference on Elecctronics, Circuits and Systems, 2001. ICECS 2001, Sep. 2, 2001, vol. 3, pp. 1223-1226.
Lin, S. et al.: "Error Control Coding-Fundamentals and Applications," 1983, Englewood Cliffs, pp. 288, XP002305226.
Luby Digital Fountain A Shokrollahi Epfl M Watson Digital Fountain T Stockhammer Nomor Research M: "Raptor Forward Error Correction Scheme for Object Delivery; rfc5053.txt", IETF Standard, Internet Engineering Task Force, IETF, CH, Oct. 1, 2007, XP015055125, ISSN: 0000-0003.
Luby, et al., "Analysis of Low Density Codes and Improved Designs Using Irregular Graphs", 1998, Proceedings of the 30th Annual ACM Symposium on Theory of Computing, May 23, 1998, pp. 249-258, XP000970907.
Luby, et al.: "Analysis of Low Density Codes and Improved Designs Using Irregular Graphs," International Computer Science Institute Technical Report TR-97-045 (Nov. 1997) [available at ftp://ftp.icsi.berkeley.edu/pub/techreports/1997/tr-97-045.pdf].
Luby, et al., "FLUTE—File Delivery over Unidirectional Transport", IETF RFC 3926, pp. 1-35, (Oct. 2004).
Luby et al., "Improved Low-Density Parity-Check Codes Using Irregular Graphs and Belief Propagation", Information Theory, 1998. Proceedings. 1998 IEEE International Symposium on Cambridge, MA, USA Aug. 16-21, 1998, pp. 1-9, New York, NY, USA, IEEE, US Aug. 16, 199.
Luby et, al. "Layered Coding Transport (LCT) Building Block", IETF RFC 5651, pp. 1-42, (Oct. 2009).
Luby, M. et al.: "Efficient Erasure Correction Codes," 2001, IEEE Transactions on Information Theory, vol. 47, No. 2, pp. 569-584, XP002305225.
Luby, M., et, al. "Forward Error Correction (FEC) Building Block", IETF RFC 5052, pp. 1-31, (Aug. 2007).
Luby M et al: "IPTV Systems, Standards and Architectures: Part II—Application Layer FEC in IPTV Services" IEEE Communications Magazine, IEEE Service Center, Piscataway, US LNKDDOI: 10.1109/MCOM.2008.4511656, vol. 46, No. 5, May 1, 2008, pp. 94-101, XP011226858 ISSN: 0163-6804.
Luby, M. et al.: "Pairwise Independence and Derandomization," Foundations and Trends in Theoretical Computer Science, vol. 1, Issue 4, 2005, Print ISSN 1551-305X, Online ISSN 1551-3068.
Luby, M. et al., "Practical Loss-Resilient Codes: Tornado Codes," 29th Annual ACM Symposium on Theory of Computing, vol. SYMP. 29, May 4, 1997, pp. 150-159, XP002271229.
Luby, M., et al., "Raptor Forward Error Correction Scheme for Object Delivery", IETF RFC5053, pp. 1-46 (Sep. 2007).
Luby M. et al., "RaptorQ Forward Error Correction Scheme for Object Delivery", IETF draft ietf-rmt-bb-fec-raptorq-04, Reliable Multicast Transport, Internet Engineering Task Force (IETF), Standard Workingdraft, Internet Society (ISOC), Aug. 24, 2010, pp. 1-68, XP015070705, [retrieved on Aug. 24, 2010].
Luby, M., et al., "Request for Comments: 3453: The Use of Forward Error Correction (FEC) in Reliable Multicast," Internet Article, [Online] Dec. 2002, pp. 1-19.
Luby, Michael G. "Analysis of Random Processes via And-Or Tree Evaluation," Proceedings of the 9th Annual ACM-SIAM Symposium on Discrete Algorithms,TR-97-0, 1998, pp. 364-373, (search date: Jan. 25, 2010) URL: <http://portal.acm.prg.citation.cfm"id=314722>.
Luby Qualcomm Incorporated, "Universal Object Delivery using RaptorQ; draft-luby-uod-raptorq-OO.txt", Internet Engineering Task Force (IETF), Standardworkingdraft, Internet Society (ISOC), Mar. 7, 2011, pp. 1-10, XP015074424, [retrieved on Mar. 7, 2011].
Mackay, "Fountain codes Capacity approaching codes design and implementation", IEE Proceedings: Communications, Dec. 9, 2005, pp. 1062-1068, vol. 152, No. 6, Institution of Electrical Engineers, XP006025749, ISSN: 1350-2425, DOI: 10.1049/IP-C0M:20050237.

(56) References Cited

OTHER PUBLICATIONS

Mandelbaum D.M., "An Adaptive-Feedback Coding Scheme Using Incremental Redundancy", IEEE Trans on Information Theory, vol. May 1974, May 1974, pp. 388-389, XP002628271, the whole document.

Marpe, et al., "The H.264/MPEG4 Advanced Video Coding Standard and its Applications," Standards Report, IEEE Communications Magazine, Aug. 2006, pp. 134-143.

Matsuoka H., et al., "Low-Density Parity-Check Code Extensions Applied for Broadcast-Communication Integrated Content Delivery", Research Laboratories, NTT DOCOMO, Inc., 3-6, Hikari-No-Oka, Yokosuka, Kanagawa, 239-8536, Japan, ITC-SS21, 2010 IEICE, pp. 59-63.

Mimnaugh, A et, al. "Enabling Mobile Coverage for DVB-T" Digital Fountain Whitepaper Jan. 29, 2008, pp. 1-9, XP002581808 Retrieved from the Internet: URL:http://www.digitalfountain.com/ufiles/library/DVB-T-whitepaper.pdf> [retrieved on May 10, 2010].

Min-Goo Kim: "On systematic punctured convolutional codes", IEEE Trans on Communications, vol. 45, No. 2, Feb. 1997, XP002628272, the whole document, pp. 133-139.

Muller, et al., "A test-bed for the dynamic adaptive streaming over HTTP featuring session mobility" MMSys '11 Proceedings of the second annual ACM conference on Multimedia systems, Feb. 23-25, 2011, San Jose, CA, pp. 271-276.

Naguib, Ayman, et al., "Applications of Space-Time Block Codes and Interference Suppression for High Capacity and High Data Rate Wireless Systems," IEEE, 1998, pp. 1803-1810.

Narayanan, et al., "Physical Layer Design for Packet Data Over IS-136", Vehicular Technology Conference, 1997, IEEE 47th Phoenix, AZ, USA May 4-7, 1997, New York, NY, USA, IEEE, US May 4, 1997, pp. 1029-1033.

Nokia: "Reed-Solomon Code Specification for. MBMS Download and Streaming Services", 3GPP Draft; S4-050265_RS_SPEC, 3rd Generation Partnership Project (3GPP), Mobile Competence Centre ; 650, Route Des Lucioles ; F-06921 Sophia-Antipolis Cedex ; France, vol. SA WG4, No. San Diego, USA; 20050415, Apr. 15, 2005, XP050287675, [retrieved on Apr. 15, 2005].

Nokia Corp., "Usage of 'mfra' box for Random Access and Seeking," S4-AHI127, 3GPP TSG-SA4 Ad-Hoc Meeting, Dec. 14-16, 2009, Paris, FR, 2 pp.

Nonnenmacher, et al., "Parity-Based Loss Recovery for Reliable Multicast Transmission", IEEE / ACM Transactions on Networking, IEEE Inc. New York, US, vol. 6, No. 4, Aug. 1, 1998, pp. 349-361.

Ozden, B. et al.: "A Low-Cost Storage Service for Movie on Demand Databases," Proceedings of the 20th Very Large DataBases (VLDB) Conference, Santiago, Chile (1994).

PA. Chou, A. Mohr, A. Wang, S. Mehrotra, "FEC and Pseudo-ARQ for Receiver-Driven Layered Multicast of Audio and Video," pp. 440-449, IEEE Computer Society, Data Compression Conference (2000).

Pantos R et al., "HTTP Live Streaming; draft-pantos-http-live-streaming-OT.txt", HTTP Live Streaming; Draft-Pant0s-http-live-streaming-01.txt, Internet Engineering Task Force, IETF; Standardworkingdraft, Internet Society (ISOC) 4, Rue Des Falaises CH—1205 Geneva, Switzerland, No. 1, Jun. 8, 2009, XP015062692.

Paris, et al., "A low bandwidth broadcasting protocol for video on demand", Proc. International Conference on Computer Communications and Networks, vol. 7, pp. 690-697 (Oct. 1998).

Paris, et al., "Efficient broadcasting protocols for video on demand", International Symposium on Modeling, Analysis and Simulation of Computer and Telecommunication systems (MASCOTS), vol. 6, pp. 127-132 (Jul. 1998).

Perkins, et al.: "Survey of Packet Loss Recovery Techniques for Streaming Audio," IEEE Network; Sep./Oct. 1998, pp. 40-48.

Petition decision for Petition Under 37 C.F.R. § 1.78 to Accept an Unintentionally Delayed Priority Claim under 35 U.S.C. § 120 in U.S. Patent No. 7,532,132, dated Jul. 21, 2011, 2 pages.

Petition under 37 C.F.R. § 1.78 to Accept an Unintentionally Delayed Priority Claim under 35 U.S.C. § 120 in U.S. Patent No. 7,532,132, dated May 27, 2011, 2 pages.

Plank J. S., "A Tutorial on Reed-Solomon Coding for Fault-Tolerance I N Raid-Like Systems", Software Practice & Experience, Wiley & Sons, Bognor Regis, GB, vol. 27, No. 9, Sep. 1, 1997, pp. 995-1012, XP00069594.

Pless and WC Huffman EDS V S: Algebraic geometry codes, Handbook of Coding Theory, 1998, pp. 871-961, XP002300927.

Pursley, et al.: "Variable-Rate Coding for Meteor-Burst Communications," IEEE Transactions on Communications, US, IEEE Inc. New York (1989) vol. 37, No. 11, pp. 1105-1112 XP000074533.

Pursley, M. et al.: "A Correction and an Addendum for Variable-Rate Coding for Meteor-Burst Communications," IEEE Transactions on Communications, vol. 43, No. 12 pp. 2866-2867 (Dec. 1995).

Pyle, et al., "Microsoft http smooth Streaming: Microsoft response to the Call for Proposal on httpstreaming", 93 MPEG Meeting; Jul. 26, 2010-Jul. 30, 2010; Geneva; (Motion Picture Expert Group or ISO/IEC JTC1/SCE29/WG11), No. M17902, Jul. 22, 2010, XP030046492.

Qualcomm Europe S A R L: "Baseline Architecture and Definitions for HTTP Streaming", 3GPP Draft; S4-090603_HTTP_Streaming_Architecture, 3rd Generation Partnership Project (3GPP), Mobile Competence Centre; 650, Route Des Lucioles; F-06921 Sophia-Antipolis Cedex; France, No. Kista; 20090812, Aug. 12, 2009, XP050356889.

Qualcomm Incorporated: "Use Cases and Examples for Adaptive httpstreaming", 3GPP Draft; S4-100408-Usecases-HSD, 3rd Generation Partnership Project (JGPP), Mobile Competence Centre; 650, Route Des Lucioles; F-06921 Sophia-Antipolis Cedex; France, vol. SA WG4, No. Prague, Czech Republic; 20100621, Jun. 17, 2010, XP050438085, [retrieved on Jun. 17, 2010].

Rangan, et al., "Designing an On-Demand Multimedia Service," IEEE Communication Magazine, vol. 30, pp. 56-64, (Jul. 1992).

Realnetworks Inc, et al., "Format for httpstreaming Media Presentation Description", 3GPP Draft; S4-100020, 3rd Generation Partnership Project (3GPP), Mobile Competence Centre; 650, Route Des Lucioles; F-06921 Sophia-Antipolis Cedex; France, vol. SA WG4, No. S t Julians, Malta; 20100125, Jan. 20, 2010, XP050437753, [retrieved on Jan. 20, 2010].

Research in Motion UK Limited: "An MPD delta file for httpstreaming", 3GPP Draft; S4-100453, 3rd Generation Partnership Project (SGPP), Mobile Competence Centre; 650, Route Des Lucioles; F-06921 Sophia-Antipolis Cedex; France, vol. SA WG4, No. Prague, Czech Republic; 20100621, Jun. 16, 2010, XP050438066, [retrieved on Jun. 16, 2010].

Rhyu, et al., "Response to Call for Proposals on httpstreaming of MPEG Media", 93 MPEG Meeting; Jul. 26, 2010-Jul. 30, 2010; Geneva; (Motion Picture Expert Group or ISO/IEC JTC1/SCE29/WG11) No. M17779, Jul. 26, 2010, XP030046369.

Rizzo, L. "Effective Erasure Codes for Reliable Computer Communication Protocols," Computer Communication Review, 27 (2) pp. 24-36 (Apr. 1, 1997), XP000696916.

Roca, V. et al.: "Design, Evaluation and Comparison of Four Large Block FEC Codecs, LDPC, LDGM, LDGM Staircase and LDGM Triangle, plus a Reed-Solomon Small Block FEC Codec," INRIA Research Report RR-5225 (2004).

Roca, V., et, al. "Low Density Parity Check (LDPC) Staircase and Triangle Forward Error Correction (FEC) Schemes", IETF RFC 5170 (Jun. 2008), pp. 1-34.

Rost, S. et al., "The Cyclone Server Architecture: streamlining delivery of popular content," 2002, Computer Communications, vol. 25, No. 4, pp. 1-10.

Roth, R., et al., "A Construction of Non-Reed-Solomon Type MDS Codes", IEEE Transactions of Information Theory, vol. 35, No. 3, May 1989, pp. 655-657.

Roth, R., "On MDS Codes via Cauchy Matrices", IEEE Transactions on Information Theory, vol. 35, No. 6, Nov. 1989, pp. 1314-1319.

Seshan, S. et al., "Handoffs in Cellular Wireless Networks: The Daedalus Implementation and Experience," Wireless Personal Communications, NL; Kluwer Academic Publishers, vol. 4, No. 2 (Mar. 1, 1997) pp. 141-162, XP000728589.

Shacham: "Packet Recovery and Error Correction in High-Speed Wide-Area Networks," Proceedings of the Military Communications Conference. (Milcom), US, New York, IEEE, vol. 1, pp. 551-557 (1989) XP000131876.

(56) References Cited

OTHER PUBLICATIONS

Shierl T; Gruneberg K; Narasimhan S; Vetro A: "ISO/IEC 13818-1:2007/FPDAM 4—Information Technology Generic Coding of Moving Pictures and Audio Systems amendment 4: Transport of Multiview Video over ITU-T Rec H.222.0 ISO/IEC 13818-1" ITU-T Rec. H.222.0(May 2006)FPDAM 4, vol. MPEG2009, No. 10572, May 11, 2009, pp. 1-20, XP002605067 p. 11, last two paragraphs sections 2.6.78 and 2.6.79 table T-1.
Shokrollahi, A.: "Raptor Codes," Internet Citation [Online] (Jan. 13, 2004) XP002367883, Retrieved from the Internet: URL:http://www.cs.huji.ac.il/labs/danss/p2p/resources/raptor.pdf.
Shokrollahi, Amin. "Raptor Codes," IEEE Transactions on Information Theory, Jun. 2006, vol. 52, No. 6, pp. 2551-2567, (search date: Feb. 1, 2010) URL: <http://portal.acm.org/citation.cfm"id=1148681>.
Shokrollahi et al., "Design of Efficient Easure Codes with Differential Evolution", IEEE International Symposium on Information Theory, Jun. 25, 2000, pp. 5-5.
Sincoskie, W. D., "System Architecture for Large Scale Video on Demand Service," Computer Network and ISDN Systems, pp. 155-162, (1991).
Smolic et al., "Development of a new MPEG standard for advanced 3D video applications", Proceedings of 6th International Symposium on Image and Signal Processing and Analysis (ISPA), Sep. 16, 2009, pp. 400-407, IEEE, XP031552049, ISBN: 978-953-184-135-1.
Stockhammer, "WD 0.1 of 23001-6 Dynamic Adaptive Streaming over HTTP (DASH)", MPEG-4 Systems, International Organisation for Standardisation, ISO/IEC JTC1/SC29/WG11, Coding of Moving Pictures and Audio, MPEG 2010 Geneva/m11398, Jan. 6, 2011, 16 pp.
Sullivan et al., Document: JVT-AA007, "Editors' Draft Revision to ITU-T Rec. H.264|ISO/IEC 14496-10 Advanced Video Coding—In Preparation for ITU-T SG 16 AAP Consent (in integrated form)," Joint Video Team (JVT) of ISO/IEC MPEG & ITU-T VCEG (ISO/IEC JTC1/SC29/WG11 and ITU-T SG16 Q.6), 30th Meeting: Geneva, CH, Jan. 29-Feb. 3, 2009, pp. 1-683, http://wftp3.itu.int/av-arch/jvt-site/2009_01_Geneva/JVT-AD007.zip.
Sun, et al., "Seamless Switching of Scalable Video Bitstreams for Efficient Streaming," IEEE Transactions on Multimedia, vol. 6, No. 2, Apr. 2004, pp. 291-303.
Telefon AB LM Ericsson, et al., "Media Presentation Description in httpstreaming", 3GPP Draft; S4-100080-MPD, 3rd Generation Partnership Project (3GPP), Mobile Competence Centre; 650, Route Des Lucioles; F-06921 Sophia-Antipolis Cedex; France, vol. SA WG4, No. St Julians, Malta; 20100125, Jan. 20, 2010, XP050437773, [retrieved on Jan. 20, 2010].
Todd, "Error Correction Coding: Mathematical Methods and Algorithms", Mathematical Methods and Algorithms, Jan. 1, 2005, pp. 451-534, Wiley, XP002618913.
Tsunoda T., et al., "Reliable Streaming Contents Delivery by Using Multiple Paths," Technical Report of the Institute of Electronics, Information and Communication Engineers, Japan, Mar. 2004, vol. 103, No. 692, pp. 187-190, NS2003-331, IN2003-286.
U.S. Appl. No. 12/840,146, by Ying Chen et al., filed Jul. 20, 2010.
U.S. Appl. No. 12/908,537, by Ying Chen et al., filed Oct. 20, 2010.
U.S. Appl. No. 12/908,593, by Ying Chen et al., filed Oct. 20, 2010.
U.S. Appl. No. 13/082,051, by Ying Chen et al., filed Apr. 7, 2011.
U.S. Appl. No. 13/205,559, by Ying Chen et al., filed Aug. 8, 2011.
U.S. Appl. No. 13/205,565, by Ying Chen et al., filed Aug. 8, 2011.
U.S. Appl. No.13/205,574, by Ying Chen et al., filed Aug. 8, 2011.
Universal Mobile Telecommunications System (UMTS); LTE; Transparent end-to-end Packet-switched Streaming Service (PSS); Protocols and codecs (3GPP TS 26.234 version 9.3.0 Release 9), Technical Specification, European Telecommunications Standards Institute (ETSI), 650, Route Des Lucioles; F-06921 Sophia-Antipolis; France, vol. 3GPP SA, No. V9.3.0, Jun. 1, 2010, XP014047290, paragraphs [5.5.4.2], [5.5.4.3], [5.5.4.4], [5.4.5], [5.5.4.6] paragraphs [10.2.3], [11.2.7], [12.2.3], [12.4.2], [12.6.2] paragraphs [12.6.3], [12.6.3.1], [12.6.4], [12.6.6].

Viswanathan, et al., "Metropolitan area video-on-demand services using pyramid broadcasting", Multimedia Systems, 4(4): 197-208 (1996).
Viswanathan, et al., "Pyramid Broadcasting for Video-on-Demand Service", Proceedings of the SPIE Multimedia Computing and Networking Conference, vol. 2417, pp. 66-77 (San Jose, CA, Feb. 1995).
Viswanathan,Subramaniyam R., "Publishing in Wireless and Wireline Environments," Ph. D Thesis, Rutgers, The State University of New Jersey (Nov. 1994), 180pages.
Watson, M., et, al. "Asynchronous Layered Coding (ALC) Protocol Instantiation", IETF RFC 5775, pp. 1-23, (Apr. 2010).
Wong, J.W., "Broadcast delivery", Proceedings of the IEEE, 76(12): 1566-1577, (1988).
Yamauchi, Nagamasa. "Application of Lost Packet Recovery by Front Error Correction to Internet Multimedia Transfer" Proceedings of Workshop for Multimedia Communication and Distributed Processing, Japan, Information Processing Society of Japan (IPS), Dec. 6, 2000, vol. 2000, No. 15, pp. 145-150.
Yin et al., "Modified Belief-Propogation algorithm for Decoding of Irregular Low-Density Parity-Check Codes", Electronics Letters, IEE Stevenage, GB, vol. 38, No. 24, Nov. 21, 2002, pp. 1551-1553.
Ying Chen et al: "Response to the CfP on HTTP Streaming: Adaptive Video Streaming based on AVC", 93 MPEG Meeting; Jul. 26, 2010-Jul. 30, 2010; Geneva; (Motion Picture Expert Group or ISO/IEC JTC1/SC29/WG11), No. M17909, Jul. 26, 2010, XP030046499.
Zorzi, et al.: "On the Statistics of Block Errors in Bursty Channels," IEEE Transactions on Communications, vol. 45, No. 6, Jun. 1997, pp. 660-667.
Anonymous: "Technologies under Consideration", 100. MPEG Meeting;Apr. 30, 2012-May 4, 2012; Geneva; (Motion Picture Expert Group or ISO/IEC JTC1 /SC291WG11),, No. N12682, Jun. 7, 2012, XP030019156.
Hannuksela M.M., et al., "DASH: Indication of Subsegments Starting with SAP", 97. MPEG Meeting; Jul. 18, 2011-Jul. 22, 2011; Torino; (Motion Picture Expert Group or ISO/IEC JTC1/SC29/WG11) No. m21096, Jul. 21, 2011, XP030049659.
Hannuksela M.M., et al., "ISOBMFF: SAP definitions and 'sidx' box", 97. MPEG Meeting; Jul. 18, 2011-Jul. 22, 2011; Torino; (Motion Picture Expert Group or ISO/IEC JTC1/SC29/WG11) No. m21435, Jul. 22, 2011, XP030049998.
Stockhammer T., et al., "DASH: Improvements on Representation Access Points and related flags", 97. MPEG Meeting; Jul. 18, 2011-Jul. 22, 2011; Torino; (Motion Picture Expert Group or ISO/IEC JTC1/SC29/WG11) No. m20339, Jul. 24, 2011, XP030048903.
Yamazaki M., et al., "Multilevel Block Modulation Codes Construction of Generalized DFT," Technical Report of the Institute of Electronics, Information and Communication Engineers, Jan. 24, 1997, vol. 96, No. 494, pp. 19-24, IT96-50.
3GPP: "3rd Generation Partnership Project; Technical Specification Group Services and system Aspects; Multimedia Broadcast/Multicast Service (MBMS); Protocols and codecs (Release 6)", Sophia Antipolis, France, Jun. 1, 2005, XP002695256, Retrieved from the Internet: URL:http://www.etsi.org/deliver/etsi_ts/126300_126399/126346/06.01.00_60/ts_126346v060100p.pdf.
3rd Generation Partnership Project; Technical Specification Group Services and System Aspects; Transparent end-to-end Packet-switched Streaming Service (PSS); Progressive Download and Dynamic Adaptive Streaming over HTTP (3GP-DASH) (Release 10), 3GPP Standard; 3GPP TS 26.247, 3rd Generation Partnership Project (3GPP), Mobile Competence Centre; 650, Route Des Lucioles; F-06921 Sophia-Antipolis Cedex; France, vol. SA WG4, No. V10.0.0, Jun. 17, 2011, pp. 1-94, XP050553206, [retrieved on Jun. 17, 2011].
Anonymous: "Technologies under Consideration", 98. MPEG Meeting; Nov. 28, 2011-Dec. 2, 2011; Geneva; (Motion Picture Expert Group or ISO/IEC JTC1/SC29/WG11), No. N12330, Dec. 3, 2011, XP030018825.
Anonymous: "Text of ISO/IEC IS 23009-1 Media Presentation Description and Segment Formats", 98. MPEG Meeting; Nov. 28, 2011-Dec. 2, 2012; Geneva; (Motion Picture Expert Group or ISO/IEC JTC1/SC29/WG11), No. N12329, Jan. 6, 2012, XP030018824.
Atis: "PTV Content on Demand Service", IIF-WT-063R44, Nov. 11, 2010, pp. 1-124, XP055045168, Retrieved from the Internet:

(56) References Cited

OTHER PUBLICATIONS

URL:ftp://vqeg.its.bldrdoc.gov/Documents/VQEG_Atlanta_Nov10/MeetingFiles/Liaison/IIF- WT-063R44_Content_on_Demand.pdf [retrieved on Nov. 22, 2012].
Bouazizi I., et al., "Proposals for ALC/FLUTE server file format (14496-12Amd.2)", 77. MPEG Meeting; Jul. 17, 2006- Jul. 21, 2006; Klagenfurt; (Motion Pictureexpert Group or ISO/IEC JTC1/SC29/WG11), No. M13675, Jul. 12, 2006, XP030042344, ISSN: 0000-0236.
"Digital Video Broadcasting (DVB); Framing structure, channel coding and modulation for digital terrestrial television; ETSI EN 300 744" ETSI Standards, LIS, Sophia Antipolis Cedex, France, V1.6.1, pp. 9, Jan. 10, 2009.
European Search Report—EP07756943—Search Authority—Munich—May 2, 2013 (091851EP).
Frojdh P., et al., "Study on 14496-12:2005/PDAM2 ALU/FLUTE Server File Format", 78.MPEG Meeting; Oct. 23, 2006-Oct. 27, 2006; Hangzhou: (Motion Picturexpert Group or ISO/IEC JTC1/SC29/WG11) No. M13855, Oct. 13, 2006, XP030042523, ISSN: 0000-0233.
Gil A., et al., "Personalized Multimedia Touristic Services for Hybrid Broadcast/Broadband Mobile Receivers," IEEE Transactions on Consumer Electronics, 2010, vol. 56 (1), pp. 211-219.
Kim J., et al., "Enhanced Adaptive Modulation and Coding Schemes Based on Multiple Channel Reportings for Wireless Multicast Systems", 62nd IEEE Vehicular Technology Conference, VTC—2005—Fall, Sep. 25-28, 2005, vol. 2, pp. 725-729, XP010878578, DOI: 1 0.11 09/VETECF.2005.1558019, ISBN: 978-0-7803-9152-9.
Li, M., et al., "Playout Buffer and Rate Optimization for Streaming over IEEE 802.11 Wireless Networks", Aug. 2009, Worcester Polytechnic Institute, USA.
Luby et al., RaptorQ Forward Error Correction Scheme for Object Delivery draft-ietf-rmt-bb-fec-raptorq-00, Qualcomm, Inc. Jan. 28, 2010.
Michael G et al., "Improved low-density parity-check codes using irregular graphs", Information Theory, IEEE Transactions on, Feb. 2001, vol. 47, No. 2, pp. 585-598.
Moriyama, S., "5. Present Situation of Terrestrial Digital Broadcasting in Europe and USA", Journal of The Institute of Image Information and Television Engineers, Nov. 20, 1999, vol. 53, No. 11, pp. 1476-1478.
Motorola et al: "An Analysis of DCD Channel Mapping to BCAST File Delivery Sessions; OMA-CD-DCD-2007-0112-INP_DCD_Channel_Mapping_to_BCAST_File_Delivery", OMA-CD-DCD-2007-0112-INP_DCD_CHANNEL_MAPPING_TO_BCAST_FILE_DELIVERY, Open Mobile Alliance (OMA), 4330 La Jolla Village Dr., Suite 110 San Diego, CA 92122; USA Oct. 2, 2007, pp. 1-13, XP064036903.
Ohashi A et al., "Low-Density Parity-Check (LDPC) Decoding of Quantized Data," Technical Report of the Institute of Electronics, Information and Communication Engineers, Aug. 23, 2002, vol. 102, No. 282, pp. 47-52, RCS2002-154.
Qualcomm Incorporated: "RaptorQ Technical Overview", pp. 1-12, Oct. 1, 2010.
Roumy A., et al., "Unequal Erasure Protection and Object Bundle Protection with the Generalized Object Encoding Approach", Inria-00612583, Version 1, Jul. 29, 2011, 25 pages.
Schulzrinne, et al., "Real Time Streaming Protocol (RTSP)" Network Working Group, Request for Comments: 2326, Apr. 1998, pp. 1-92.
Wadayama T, "Introduction to Low Density Parity Check Codes and Sum-Product Algorithm," Technical Report of the Institute of Electronics, Information and Communication Engineers, Dec. 6, 2001, vol. 101, No. 498, pp. 39-46, MR2001-83.
Bross, et al., "High efficiency video coding (HEVC) text specification draft 6," JCTVC-H1003, Joint Collaborative Team on Video Coding (JCT-VC) of ITU-T SG16 WP3 and ISO/IEC JTC1/SC29/WG11, 8th Meeting: San José, CA, USA, Feb. 1-10, 2012, 259 pp.

Makoto N., et al., "On Turning of Blocking LU decomposition for VP2000 series" The 42th Information Processing Society of Japan Conference (1st term in 1991), Feb. 25, 1991, pp. 71-72, 4B-8.
Miller G., et al., "Bounds on the maximum likelihood decoding error probability of low density parity check codes", Information Theory, 2000. Proceesings. IEEE International Symposium on, 2000, p. 290.
Muramatsu J., et al., "Low density parity check matrices for coding of multiple access networks", Information Theory Workshop, 2003. Proceedings. 2003 IEEE, Apr. 4, 2003, pp. 304-307.
Samukawa, H. "Blocked Algorithm for LU Decomposition" Journal of the Information Processing Society of Japan, Mar. 15, 1993, vol. 34, No. 3, pp. 398-408.
3GPP TSG-SA4 #57 S4-100015, IMS based PSS and MBMS User Service extensions, Jan. 19, 2010, URL: http://www.3gpp.org/ftp/tsg_sa/WG4_CODEC/TSGS4_57/docs/S4-100015.zip.
3rd Generation Partnership Project; Technical Specification Group Services and System Aspects; Transparent end-to-end Packet-switched Streaming Service (PSS);Protocols and codecs(Release 9) 3GPP TS 26.234 V9.3.0, Jun. 23, 2010 p. 85-102, URL, http://www.3gpp.org/ftp/TSG_SA/WG4_CODEC/TSGS4_59/Docs/S4-100511.zip, 26234-930.zip.
Lee, J.Y., "Description of Evaluation Experiments on ISO/IEC 23001-6, Dynamic Adaptive Streaming over HTTP", ISO/IEC JTC1/SC29/WG11MPEG2010/N11450, Jul. 31, 2010, 16 pp.
Luby M., "Simple Forward Error Correction (FEC) Schemes," draft-luby-rmt-bb-fec-supp-simple-00.txt, pp. 1-14, Jun. 2004.
Luby M., "LT Codes", Foundations of Computer Science, 2002, Proceedings, The 43rd Annual IEEE Symposium on, 2002.
Morioka S., "A Verification Methodology for Error Correction Circuits over Galois Fields", Tokyo Research Laboratory, IBM Japan Ltd, pp. 275-280, Apr. 22-23, 2002.
Qualcomm Incorporated: "Adaptive HTTP Streaming: Complete Proposal", 3GPP TSG-SA4 AHI Meeting S4-AHI170, Mar. 2, 2010, URL, http://www.3gpp.org/FTP/tsg_sa/WG4_CODEC/Ad-hoc_MBS/Docs_AHI/S4-AHI170.zip, S4-AH170_CR_AdaptiveHTTPStreaming-Full.doc.
Qualcomm Incorporated: "Corrections to 3GPP Adaptive HTTP Streaming", 3GPP TSG-SA4 #59 Change Request 26.234 CR0172 S4-100403, Jun. 16, 2010, URL, http://www.3gpp.org/FTP/tsg_sa/WG4_CODEC/TSGS4_59/Docs/S4-100403.zip, S4-100403_CR_26234-0172-AdaptiveHTTPStreaming-Rel-9.doc.
Chikara S., et al., "Add-on Download Scheme for Multicast Content Distribution Using LT Codes", IEICE. B, Communications, Aug. 1, 2006, J89-B (8), pp. 1379-1389.
Gerard F., et al., "HTTP Streaming MPEG media—Response to CFP", 93. MPEG Meeting, Geneva Jul. 26, 2010 to Jul. 30, 2010.
Hasan M A., et al., "Architecture for a Low Complexity Rate-Adaptive Reed-Solomon Encoder", IEEE Transactions on Computers, IEEE Service Center, Los Alamitos, CA, US, vol. 44, No. 7, Jul. 1, 1995, pp. 938-942, XP000525729, ISSN: 0018-9340, DOI: 10.1109/12.392853.
Tetsuo M., et al., "Comparison of Loss Resilient Ability between Multi-Stage and Reed-Solomon Coding", Technical report of IEICE. CQ, Communication Quality, vol. 103 (178), Jul. 4, 2003, pp. 19-24.
Watson M., et al., "Forward Error Correction (FEC) Framework draft-ietf-fecframe-framework-11," 2011, pp. 1-38, URL, http://tools.ietf.org/pdf/draft-ietf-fecframe-framework-11.pdf.
Watson M., et al., "Raptor FEC Schemes for FECFRAME draft-ietf-fecframe-raptor-04," 2010, pp. 1-21, URL, http://tools.ietf.org/pdf/draft-ietf-fecframe-raptor-04.pdf.
Qualcomm Incorporated: "RatorQ Forward Error Correction Scheme for Object Delivery draft-ietf-rmt-bb-fec-raptorq-04", Internet Engineering Task Force, IETF, pp. 1-68, Aug. 24, 2010.
Ramsey B, "HTTP Status: 206 Partial Content and Range Requests," May 5, 2008 obtained at http://benramsey.com/blog/2008/05/206-partial-content-and-range-requests/.

* cited by examiner

```
                     1                   2                   3
 0 1 2 3 4 5 6 7 8 9 0 1 2 3 4 5 6 7 8 9 0 1 2 3 4 5 6 7 8 9 0 1
+-+-+-+-+-+-+-+-+-+-+-+-+-+-+-+-+-+-+-+-+-+-+-+-+-+-+-+-+-+-+-+-+
|    Initial Sequence Number    |      Encoding Symbol ID       |
+-+-+-+-+-+-+-+-+-+-+-+-+-+-+-+-+-+-+-+-+-+-+-+-+-+-+-+-+-+-+-+-+
|     Source Block Length       |
+-+-+-+-+-+-+-+-+-+-+-+-+-+-+-+-+
```

Fig. 8

```
                     1                   2                   3
 0 1 2 3 4 5 6 7 8 9 0 1 2 3 4 5 6 7 8 9 0 1 2 3 4 5 6 7 8 9 0 1
+-+-+-+-+-+-+-+-+-+-+-+-+-+-+-+-+-+-+-+-+-+-+-+-+-+-+-+-+-+-+-+-+
|   Version   |    Msg Type    |Initial Source Block Identifier|
+-+-+-+-+-+-+-+-+-+-+-+-+-+-+-+-+-+-+-+-+-+-+-+-+-+-+-+-+-+-+-+-+
|    Number of Source Blocks    |                               |
+-+-+-+-+-+-+-+-+-+-+-+-+-+-+-+-+                               |
.                            Payload                            .
|                                                               |
+-+-+-+-+-+-+-+-+-+-+-+-+-+-+-+-+-+-+-+-+-+-+-+-+-+-+-+-+-+-+-+-+
```

Fig. 9

```
                     1                   2                   3
 0 1 2 3 4 5 6 7 8 9 0 1 2 3 4 5 6 7 8 9 0 1 2 3 4 5 6 7 8 9 0 1
+-+-+-+-+-+-+-+-+-+-+-+-+-+-+-+-+-+-+-+-+-+-+-+-+-+-+-+-+-+-+-+-+
| Number of Error Free Blocks   |    Number of decoded blocks   |
+-+-+-+-+-+-+-+-+-+-+-+-+-+-+-+-+-+-+-+-+-+-+-+-+-+-+-+-+-+-+-+-+
| Number of Undecodable Blocks  |     Max Packets Received      |
+-+-+-+-+-+-+-+-+-+-+-+-+-+-+-+-+-+-+-+-+-+-+-+-+-+-+-+-+-+-+-+-+
|      Min Packets Received     |   Total packets received (MSB)|
+-+-+-+-+-+-+-+-+-+-+-+-+-+-+-+-+-+-+-+-+-+-+-+-+-+-+-+-+-+-+-+-+
|  Total packets received (LSB) |
+-+-+-+-+-+-+-+-+-+-+-+-+-+-+-+-+
```

Fig. 10

STREAMING AND BUFFERING USING VARIABLE FEC OVERHEAD AND PROTECTION PERIODS

CROSS REFERENCE

This application claims priority from and is a non-provisional of U.S. Provisional Patent Application No. 60/773,185 filed Feb. 13, 2006 and U.S. Provisional Patent Application No. 60/773,501 filed Feb. 14, 2006.

The following references are include here and are incorporated by reference for all purposes:

U.S. Pat. No. 6,307,487 entitled "Information Additive Code Generator and Decoder for Communication Systems" issued to Luby (hereinafter "Luby"); and U.S. Pat. No. 7,068,729 issued to Shokrollahi et al. entitled "Multi-Stage Code Generator and Decoder for Communication Systems" (hereinafter "Shokrollahi").

FIELD OF THE INVENTION

The present invention relates to encoding and decoding data in communications systems and more specifically to communication systems that encode and decode data to account for errors and gaps in communicated data while dealing with the needs of receivers to quickly provide data as it is received.

BACKGROUND OF THE INVENTION

Transmission of files and streams between a sender and a recipient over a communications channel has been the subject of much literature. Preferably, a recipient desires to receive an exact copy of data transmitted over a channel by a sender with some level of certainty. Where the channel does not have perfect fidelity (which covers most all physically realizable systems), one concern is how to deal with data lost or garbled in transmission. Lost data (erasures) are often easier to deal with than corrupted data (errors) because the recipient cannot always tell when corrupted data is data received in error. Many error-correcting codes have been developed to correct for erasures and/or for errors.

Data transmission is straightforward when a transmitter and a receiver have all of the computing power and electrical power needed for communications and the channel between the transmitter and receiver is clean enough to allow for relatively error-free communications. The problem of data transmission becomes more difficult when the channel is in an adverse environment or the transmitter and/or receiver has limited capability.

One solution is the use of forward error correcting (FEC) techniques, wherein data is coded at the transmitter such that a receiver can recover from transmission erasures and errors. Where feasible, a reverse channel from the receiver to the transmitter allows for the receiver to communicate about errors to the transmitter, which can then adjust its transmission process accordingly. Often, however, a reverse channel is not available or feasible or is available only with limited capacity. For example, where the transmitter is transmitting to a large number of receivers, the transmitter might not be able to handle reverse channels from all those receivers. As a result, communication protocols often need to be designed without a reverse channel or with a limited capacity reverse channel and, as such, the transmitter may have to deal with widely varying channel conditions without a full view of those channel conditions.

In the case of a packet protocol used for data transport over a channel that can lose packets, a file, stream or other block of data to be transmitted over a packet network is partitioned into equal size input symbols, encoding symbols the same size as the input symbols are generated from the input symbols using an FEC code, and the encoding symbols are placed and sent in packets. The "size" of a symbol can be measured in bits, whether or not the symbol is actually broken into a bit stream, where a symbol has a size of M bits when the symbol is selected from an alphabet of $2^M$ symbols. In such a packet-based communication system, a packet oriented erasure FEC coding scheme might be suitable. A file transmission is called reliable if it allows the intended recipient to recover an exact copy of the original file even in the face of erasures in the network. A stream transmission is called reliable if it allows the intended recipient to recover an exact copy of each part of the stream in a timely manner even in the face of erasures in the network. Both file transmission and stream transmission can also be somewhat reliable, in the sense that some parts of the file or stream are not recoverable or for streaming if some parts of the stream are not recoverable in a timely fashion. Packet loss often occurs because sporadic congestion causes the buffering mechanism in a router to reach its capacity, forcing it to drop incoming packets. Protection against erasures during transport has been the subject of much study.

In the case of a protocol used for data transmission over a noisy channel that can corrupt bits, a block of data to be transmitted over a data transmission channel is partitioned into equal size input symbols, encoding symbols of the same size are generated from the input symbols and the encoding symbols are sent over the channel. For such a noisy channel the size of a symbol is typically one bit or a few bits, whether or not a symbol is actually broken into a bit stream. In such a communication system, a bit-stream oriented error-correction FEC coding scheme might be suitable. A data transmission is called reliable if it allows the intended recipient to recover an exact copy of the original block even in the face of errors (symbol corruption, either detected or undetected in the channel). The transmission can also be somewhat reliable, in the sense that some parts of the block may remain corrupted after recovery. Symbols are often corrupted by sporadic noise, periodic noise, interference, weak signal, blockages in the channel, and a variety of other causes.

One problem with some FEC codes is that they require excessive computing power or memory to operate. Another problem is that the number of output symbols must be determined in advance of the coding process. This can lead to inefficiencies if the loss rate of packets is overestimated, and can lead to failure if the loss rate of packets is underestimated.

Chain reaction codes are FEC codes that allow for generation of an arbitrary number of output symbols from the fixed input symbols of a file or stream. Sometimes, they are referred to as fountain or rateless FEC codes, since the code does not have an a-priori fixed transmission rate and the number of possible output symbols can be independent of the number of input symbols. Novel techniques for generating, using and operating chain reaction codes are shown, for example, in Luby and Shokrollahi.

It is also known to use multi-stage chain reaction ("MSCR") codes, such as those described in Shokrollahi and developed by Digital Fountain, Inc. under the trade name "Raptor" codes. Multi-stage chain reaction codes are used, for example, in an encoder that receives input symbols from a source file or source stream, generates intermediate symbols from the input symbols and the intermediate symbols are the source symbols for a chain reaction encoder.

For some applications, other variations of codes might be more suitable or otherwise preferred. As used herein, input symbols refer to the data received from a file or stream and source symbols refer to the symbols that are used to generate output symbols. In some cases, the source symbols include the input symbols and in some cases, the source symbols are the input symbols. However, there are cases where the input symbols are encoded and/or transformed into an intermediate set of symbols and that intermediate set is used to generate the output symbols without reference to the input symbols (directly). Thus, input symbols comprise information known to the sender which is to be communicated to the receiver, source symbols are the symbols used by at least one stage of an encoder and are derived from the input symbols, and output symbols comprise symbols that are transmitted by the sender to the receiver.

In some applications, the receiver may begin to use the data before the transmission is complete. For example, with a video-on-demand system, the receiver might start playing out a video after only a small portion of the video data is received and assume that the rest of the video data will be received before it is needed. In such systems, encoding should not be done over the entire transmission, because then some output symbols at the end of the transmission might encode for input symbols needed at the beginning of the video, in which case those output symbols are wasteful since their information is needed when it is not available and is not needed when it is available. To avoid this, the data stream is typically divided into blocks wherein the input data of the block is encoded and sent before the next block is prepared and blocks normally do not depend on input symbols outside those blocks.

For such applications, there is often a trade-off between reliability and lag time between when the transmission starts and when the data can start to be used. For example, if an entire feature length movie were encoded such that errors at the start of the transmission can be corrected using data at the end of the transmission, the receiver might wait until it receives all of the movie data before indicating to the application (or the user of the application) that the movie is available for playback. However, where the total transmission time is long, that can be an unacceptable lag time.

One solution is to encode a stream of data such that the receiver has enough information to begin playback of the movie after some smaller lag time and the receiver can expect to receive further information in time to continue the playback. Naturally, if the data near the end of the transmission provides redundancy for the data at the start of the transmission, that capability is wasted since the first part of the movie will have played back long before that later information is received. Thus, it is efficient to have the redundancy available when it is needed, typically close in time with the decoding of the data. However, if the constraints are too strict, playback might have to begin too early and raise the probability that the receiver hits a playback point in the movie where it does not yet have enough data to decode and would cause a skip or pause.

There are tradeoffs with the use of blocks: too small a block size and not enough error protection is provided, whereas too large a block size and too much delay is seen at the receiver as it waits for blocks to be completely recovered.

SUMMARY OF THE INVENTION

In embodiments of the present invention, data is streamed from a transmitter to a receiver, wherein streaming is transferring data with an assumption that the receiver will begin using the data before it is all transmitted and received. The streamed data includes forward error correction ("FEC") and the rates of data consumption can vary. The transmitter has an input rate at which it uses up its input data and a transmit rate at which it sends that data (and FEC data as needed) and the two rates can be different and can change when FEC is involved, as there is some overhead involved with FEC coding. At the receiver, there is a reception rate (at which the receiver receives data) and a consumption rate (at which the receiver uses up data for its output). The transmitter transmits using a transmit rate higher than the consumption rate and the extra bandwidth is usable for FEC protection and buffering.

In some embodiments, the excess rate varies over a transmission period.

A further understanding of the nature and the advantages of the inventions disclosed herein may be realized by reference to the remaining portions of the specification and the attached drawings.

BRIEF DESCRIPTION OF THE DRAWINGS

FIG. 8 is a diagram of an alternative repair FEC payload ID format.

FIG. 9 is a diagram of an FEC feedback protocol message format.

FIG. 10 is a diagram of a payload format for success report messages.

DETAILED DESCRIPTION OF THE INVENTION

Figure 1:
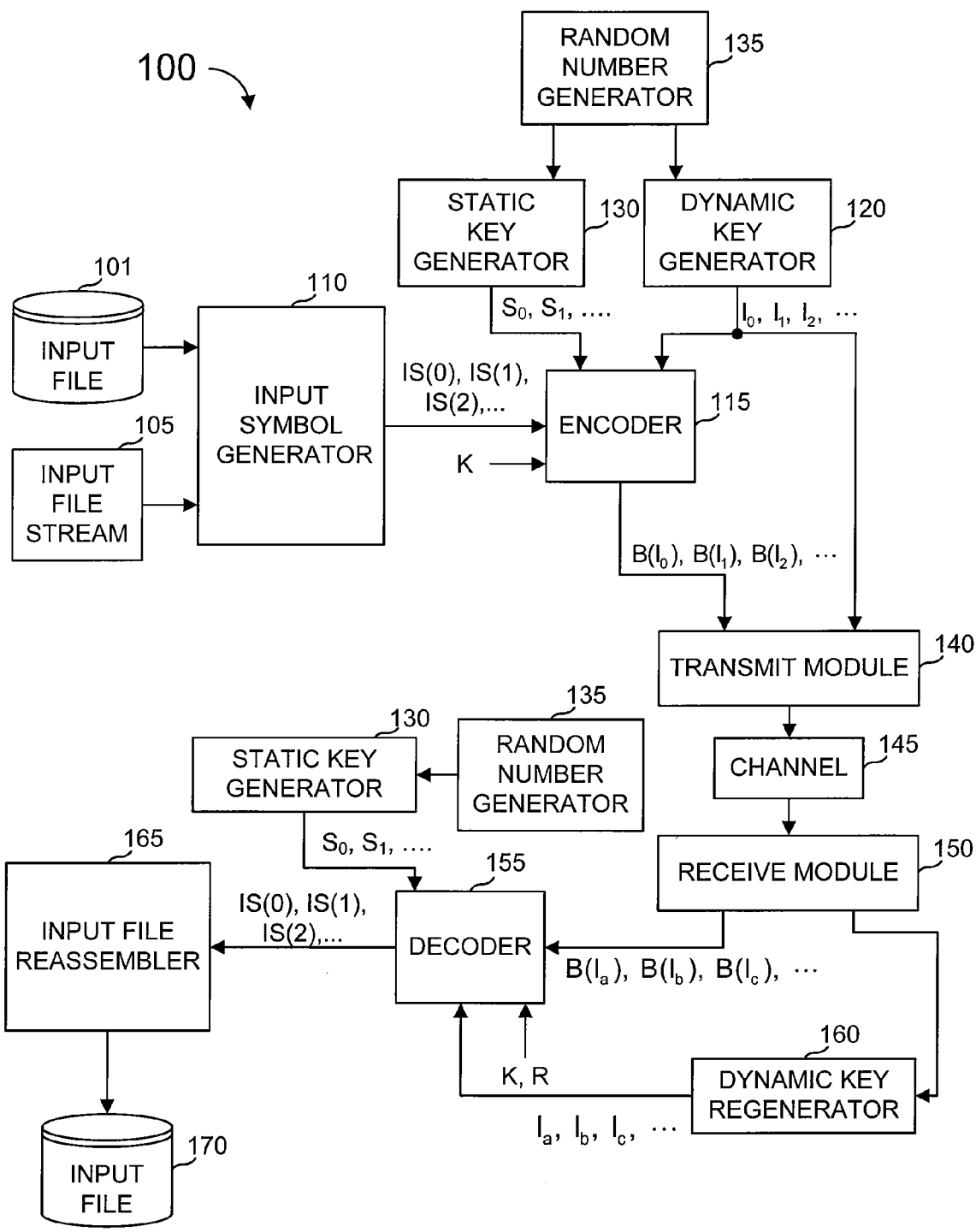
FIG. 1 is a block diagram of a communications system that can use the variable FEC overhead techniques described herein.

In embodiments of the present invention, data is streamed from a transmitter to a receiver, wherein streaming is transferring data with an assumption that the receiver will begin using the data before it is all transmitted and received. The streamed data includes forward error correction ("FEC"), which provides improvements over a retransmission-request scheme wherein retransmission of lost packets is requested by a receiver if packet loss is detected.

There are various rates involved in a streaming process. The streamed data includes forward error correction ("FEC") and the rates of data consumption can vary. The transmitter has an input rate at which it uses up its input data and a transmit rate at which it sends that data (and FEC data as needed) and the two rates can be different and can change when FEC is involved, as there is some overhead involved with FEC coding. At the receiver, there is a reception rate (at which the receiver receives data) and a consumption rate (at which the receiver uses up data for its output). In the absence of data loss over the channel, the reception rate is the same as the transmission rate. There is a raw reception rate, which is the rate at which data is received not counting overhead due to FEC. For example, if the receiver is a video player that outputs an 11 megabits/second (MBS) video stream to a display device, the consumption rate is 11 MBS. Where the consumed data is played out, on a display, audio, processor or other player of data, the consumption rate might be referred to as the "playout" rate.

With many streams, it is desirable that the consumption be continuous such that the presentation of streamed data is not stalled or blocky, which would occur if all the data at the receiver is consumed and the reception rate is less than the consumption rate. To avoid this, receivers typically have buffers so that the reception rate can temporarily drop below the consumption rate (due to packet loss, congestion, etc.) without running out of data to consume.

Where the reception rate is exactly the consumption rate, there is no extra to be buffered. To fill the receiver buffer, a streaming system might be set up such that the transmission rate is higher than the consumption rate, or the transmission starts before the play-out begins. In either case, there is sufficient reception to at least partially fill the receiver buffer.

In any case, using FEC rather than retransmission is often the better approach. With retransmission, there needs to be enough of a receiver buffer to continue to play out data while the receiver sends a retransmission request and receives a response, otherwise the player will stall when it reaches the missing data that has yet to be replaced.

In specific embodiments, the transmitter transmits using a transmit rate higher than the consumption rate and the extra bandwidth is used in part for FEC protection and in part for buffer filling to allow for features such as a "quick start", where playout can begin soon after reception starts with sufficient buffer fill to reduce the risk of stalling the playout.

In some embodiments, the bandwidth used for FEC protection and the amount of overhead used for buffer filling varies over time. For example, the overall transmission bit-rate might be a constant value, somewhat higher than the consumption rate, with more of the excess devoted to buffer filling at the start of the transmission and less devoted to buffer filling at later times. With a constant bit rate, the FEC protection would be less at the start of the transmission and higher at later times. A constant bit rate is not required and a constant FEC overhead rate might be used.

Overview

Protocols for FEC protection of streaming media using multi-stage chain reaction (MSCR) codes, such as those used by DF Raptor™ encoders and decoders are described below for applications including DVB-IPI applications. Examples of such multi-stage codes are described in Shokrollahi. It should be understood for the purposes of this disclosure that MSCR codes are used as just examples of multi-stage codes and the teachings of this disclosure could be used with multi-stage codes other than the those described in Shokrollahi.

The multi-stage codes could be used for FEC protection of DVB-IPI real-time applications (multicast and unicast video with both MPEG-2 Transport Stream encapsulation and direct transport of audio and video over RTP).

The FEC Building Block [3] defined by the IETF Reliable Multicast working group describes an approach to specification of protocols using FEC which separates the definition of the protocol from the specification of the FEC code itself. This allows issues of protocol design to be addressed independently from the very different issues of FEC code selection. In the language of the FEC Building Block, separate specifications are provided for "Content Delivery Protocols" and for "FEC Schemes", the former defining the protocols and the latter defining the actual FEC codes. The FEC Building Block describes rules that both kinds of specification must follow so that they can be used together and so it provides the "glue" between Content Delivery Protocols and FEC Schemes.

Following this approach, this specification is organized as a number of modular components. These are then combined to form complete protocols suitable for the DVB-IPI applications. These components include (1) an FEC Streaming Framework, which provides an overall protocol framework for the application of FEC to media streams and is described in Section 2; (2) a number of FEC Schemes, which define protocol components suitable for various classes of application and which define how core MSCR codes are applied to streaming applications, defined in Section 3; (3) modular protocol components that can be used to support applications based on the FEC Streaming Framework and FEC Schemes defined herein, shown in Section 4; and (4) protocol specifications for multicast and unicast video with both MPEG-2 Transport Stream encapsulation and direct transport of audio and video over RTP, constructed using the building blocks described above (Section 5).

Terms and Acronyms

TABLE 2

Terms and Acronyms

| Term/Acronym | Definition/Description |
|---|---|
| Bundle | Collection of Streams (a.k.a. Flows) that are collected into a single Source Block, and used to generate a single stream of Repair Symbols. For example, a low-bitrate audio stream might be bundled with a high-bitrate stream, providing better FEC protection than if it hadn't been bundled. |
| Flow | Another term for "Stream", used in the context of Bundles. |
| Intermediate Block | A block of data derived from the original Source Block data in the case of an MSCR encoder or the combination of Received Source Symbols and Repair Symbols in the case of an MSCR decoder. |
| Repair Symbol | A Symbol generated by the MSCR encoder that is derived from Source Symbols. |
| Source Block | A block of source data over which the MSCR encoder provides FEC repair information. |
| Source Symbol | The unit of data from a Source Block. All Source Symbols within a source block are the same size. |
| FEC | Forward Error Correction |
| Encoding Symbol | A source symbol or a repair symbol |
| Source Packet Information (SPI) | Information included in a source block related to or from a source packet |
| FEC Streaming Configuration Information | Information which controls the operation of the FEC Streaming Framework. |

Encoders and Decoders

FIG. 1 is a block diagram of a communications system 100 that uses multi-stage coding and can use the variable FEC overhead techniques described herein.

In communications system 100, an input file 101, or an input stream 105, is provided to an input symbol generator 110. Input symbol generator 110 generates a sequence of one or more input symbols (IS(0), IS(1), IS(2), . . . ) from the input file or stream, with each input symbol having a value and a position (denoted in FIG. 1 as a parenthesized integer). As explained above, the possible values for input symbols, i.e., its alphabet, is typically an alphabet of $2^M$ symbols, so that each input symbol codes for M bits of the input file. The value of M is generally determined by the use of communication system 100, but a general purpose system might include a symbol size input for input symbol generator 110 so that M can be varied from use to use. The output of input symbol generator 110 is provided to an encoder 115.

Static key generator 130 produces a stream of static keys $S_0, S_1, \ldots$ . The number of static keys generated is generally limited and depends on the specific embodiment of encoder 115. The generation of static keys will be subsequently described in more detail. Dynamic key generator 120 generates a dynamic key for each output symbol to be generated by the encoder 115. Each dynamic key is generated so that a large fraction of the dynamic keys for the same input file are unique. For example, Luby I describes embodiments of key generators that can be used. The outputs of dynamic key generator 120 and the static key generator 130 are provided to encoder 115.

From each key I provided by dynamic key generator 120, encoder 115 generates an output symbol, with a value B(I), from the input symbols provided by the input symbol generator. The operation of encoder 115 will be described in more detail below. The value of each output symbol is generated based on its key, on some function of one or more of the input symbols, and possibly on or more redundant symbols that had been computed from the input symbols. The collection of input symbols and redundant symbols that give rise to a specific output symbol is referred to herein as the output symbol's "associated symbols" or just its "associates". The selection of the function (the "value function") and the associates is done according to a process described in more detail below. Typically, but not always, M is the same for input symbols and output symbols, i.e., they both code for the same number of bits.

In some embodiments, the number K of input symbols is used by the encoder 115 to select the associates. If K is not known in advance, such as where the input is a streaming file, K can be just an estimate. The value K might also be used by encoder 115 to allocate storage for input symbols and any intermediate symbols generated by encoder 115.

Encoder 115 provides output symbols to a transmit module 140. Transmit module 140 is also provided the key of each such output symbol from the dynamic key generator 120. Transmit module 140 transmits the output symbols, and depending on the keying method used, transmit module 140 might also transmit some data about the keys of the transmitted output symbols, over a channel 145 to a receive module 150. Channel 145 is assumed to be an erasure channel, but that is not a requirement for proper operation of communication system 100. Modules 140, 145 and 150 can be any suitable hardware components, software components, physical media, or any combination thereof, so long as transmit module 140 is adapted to transmit output symbols and any needed data about their keys to channel 145 and receive module 150 is adapted to receive symbols and potentially some data about their keys from channel 145. The value of K, if used to determine the associates, can be sent over channel 145, or it may be set ahead of time by agreement of encoder 115 and decoder 155.

As explained above, channel 145 can be a real-time channel, such as a path through the Internet or a broadcast link from a television transmitter to a television recipient or a telephone connection from one point to another, or channel 145 can be a storage channel, such as a CD-ROM, disk drive, Web site, or the like. Channel 145 might even be a combination of a real-time channel and a storage channel, such as a channel formed when one person transmits an input file from a personal computer to an Internet Service Provider (ISP) over a telephone line, the input file is stored on a Web server and is subsequently transmitted to a recipient over the Internet.

Because channel 145 is assumed to be an erasure channel, communications system 100 does not assume a one-to-one correspondence between the output symbols that exit receive module 150 and the output symbols that go into transmit module 140. In fact, where channel 145 comprises a packet network, communications system 100 might not even be able to assume that the relative order of any two or more packets is preserved in transit through channel 145. Therefore, the key of the output symbols is determined using one or more of the keying schemes described above, and not necessarily determined by the order in which the output symbols exit receive module 150.

Receive module 150 provides the output symbols to a decoder 155, and any data receive module 150 receives about the keys of these output symbols is provided to a dynamic key regenerator 160. Dynamic key regenerator 160 regenerates the dynamic keys for the received output symbols and provides these dynamic keys to decoder 155. Static key generator 163 regenerates the static keys $S_0, S_1, \ldots$ and provides them to decoder 155. The static key generator has access to random number generator 135 used both during the encoding and the decoding process. This can be in the form of access to the same physical device if the random numbers are generated on such device, or in the form of access to the same algorithm for the generation of random numbers to achieve identical behavior. Decoder 155 uses the keys provided by dynamic key regenerator 160 and static key generator 163 together with the corresponding output symbols, to recover the input symbols (again IS(0), IS(1), IS(2), . . . ). Decoder 155 provides the recovered input symbols to an input file reassembler 165, which generates a copy 170 of input file 101 or input stream 105.

Encoder 115 can encode data using techniques shown herein so that the FEC encoding has variable overhead.

2 FEC Streaming Framework 2.1 Introduction

This section defines a framework for the definition of CDPs, in the sense of the FEC Building Block, which provides for FEC protection of streamed data flows over UDP. This section does not define a complete Content Delivery Protocol, but rather defines only those aspects that are expected to be common to all Content Delivery Protocols that support streaming data over UDP.

The framework defined in this section is not specific to a single streaming application protocol. The framework provides FEC protection for application protocol flows over UDP and for combined protection of multiple such flows. For example, multiple RTP flows may be protected together with the associated RTCP flows and potentially also other related flows such as MIKEY packets. For many FEC Schemes in many loss conditions, the improvement in reliability achievable through the use of FEC with a given FEC overhead increases as the amount of data protected as a single block increases. Thus there is considerable advantage in the ability to protect multiple streams together, particularly in cases where the receiver requires all the streams in order to offer a useful service to the user.

This framework does not define how the flows to be protected are determined, nor how the details of the protected flows and the FEC streams which protect them are communicated from sender to receiver. Complete Content Delivery Protocol specifications—such as those presented in Section 5—address these signalling requirements. However, this section does specify the information which is required by the FEC Streaming Framework at sender and receiver—for example details of the flows to be FEC protected and the flow(s) that will carry the FEC protection data. We also specify SDP attributes which the Content Delivery Protocols use to communicate this information.

Figure 2:
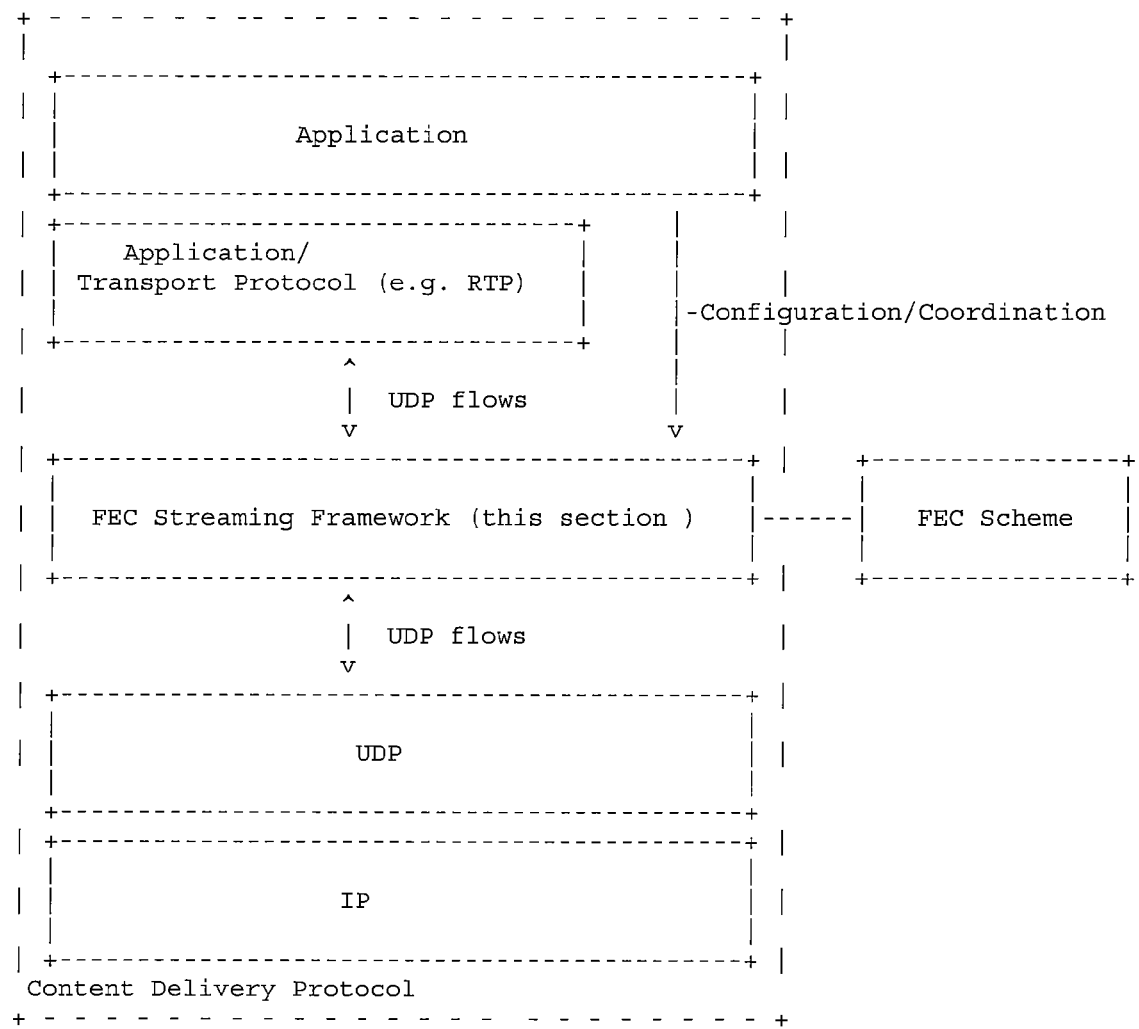
FIG. 2 is a diagram of an FEC streaming framework architecture.

The architecture outlined above is illustrated in FIG. 2.

2.2 Procedural Overview
2.2.1 General

The mechanism defined in this section comprises three components:

(i) construction of a 'source block' from source media packets belonging to one or several UDP packet flows. The UDP flows may include, for example, RTP, RTCP and SRTP packets and also other protocols related to the stream.

(ii) optional extension of source packets to indicate the source block and the position within the source block occupied by the data from and related to the source packet.

(iii) definition of repair packets, sent over UDP, which can be used by the FEC decoder to reconstruct missing portions of the source block.

The mechanism does not place any restrictions on the source data which can be protected together, except that the source data is carried over UDP. The data may be from several different UDP flows that are protected jointly. In general, multiple source blocks will be constructed for a stream each constructed from different sets of source packets. For example, each source block may be constructed from those source packets related to a particular segment of the stream in time.

A receiver supporting this streaming framework should support the packet format for FEC Source packets and should also support the packet format for FEC Repair packets.

This section does not define how the sender determines which source packets are included in which source blocks. A specific Content Delivery Protocol may define this mapping or it may be left as implementation dependent at the sender. However, a CDP specification should define how a receiver determines the length of time it should wait to receive FEC repair packets for any given source block.

At the sender, the mechanism processes original UDP packets to create:

(i) a stored copy of the original packets in the form of one or more 'source block(s)'. The source block is a logical block of data to which the FEC code will subsequently be applied. It is constructed by concatenating 'Source Packet Information' (SPI) for each source packet. Generally, the SPI for a packet contains a short identifier for the flow the packet belongs to, the length of the packet, the UDP payload and possible padding bytes.

(ii) FEC Source packets for transmission to the receiver.

The FEC Streaming Framework uses the FEC encoder specified by the FEC Scheme in use to generate the desired quantity of repair symbols from a source block. These repair symbols are then sent using the FEC repair packet format to the receiver. The FEC Repair packets are sent to a UDP destination port different from any of the original UDP packets' destination port(s) as indicated by the FEC Streaming Configuration Information.

The receiver recovers original source packets directly from any FEC Source packets received. The receiver also uses the received FEC Source Packets to construct a stored copy of the original packets in the same source block format as constructed at the sender.

If any FEC Source packets related to a given source block have been lost, then this copy of the source block at the receiver will be incomplete. If sufficient FEC source and FEC Repair packets related to that source block have been received, the FEC Framework may use the FEC decoding algorithm defined by the FEC Scheme to recover a (hopefully, but not necessarily, complete) copy of the source block. The SPI for the missing source packets can then be extracted from the completed parts of the source block and used to reconstruct the source packets to be passed to the application.

Note that the receiver may need to buffer received source packets to allow time for the FEC Repair packets to arrive and FEC decoding to be performed before some or all of the received or recovered packets are passed to the application. If such a buffer is not provided, then the application must be able to deal with the severe re-ordering of packets that will be required. However, such buffering is Content Delivery Protocol and/or implementation-specific and is not specified here.

The receiver of FEC Source packets identifies the source block and the position within the source block occupied by the SPI derived from each packet. This information is known as FEC Source Packet Identification Information and may be communicated in several ways. The FEC Source Packet Identification Information may be encoded into a specific field within the FEC Source packet format defined in this specification, called the Source FEC Payload ID field. The exact contents and format of the Source FEC Payload ID field are defined by the FEC Scheme. Alternatively, the FEC Scheme or CDP may define how the FEC Source Packet Identification Information is derived from other fields within the source packets. This document defines the way that the Source FEC Payload ID field, if used, is appended to source packets to form FEC Source packets.

The receiver of FEC Repair packets should also be able to identify the source block and the relationship between the contained repair data and the original source block. This information is known as FEC Repair Packet Identification information. This information should be encoded into a specific field, the Repair FEC Payload ID field, the contents and format of which are defined by the FEC Scheme.

Any FEC Schemes to be used in conjunction with this specification should be a systematic FEC Scheme and should be based on source blocks. The FEC Scheme may define different FEC Payload ID field formats for FEC Source packets and FEC Repair packets.

2.2.2 Sender Operation

It is assumed that the sender has constructed or received original data packets for the session. These may be RTP, RTCP, MIKEY or other UDP packets. The following operations describe a possible way to generate compliant FEC Source packet and FEC repair packet streams:

1. A source block is constructed as specified in Section 2.3.2, by concatenating the SPI for each original source packet. In doing so, the Source FEC Packet Identification Information of the FEC Source packet can be determined and included in the Source FEC Payload ID field, if used. In the SPI the identity of the packet's UDP flow is marked using a short 'UDP flow ID', defined in this specification. The association of UDP flow specifications to UDP flow IDs is defined by the FEC Streaming Configuration Information.

2. The FEC Source packet is constructed according to Section 2.3.3. The identity of the original flow is maintained by the source packet through the use of the same UDP ports and IP addresses which have been advertised by the Content Delivery Protocol (for example using DVB Service Discovery), as carrying FEC Source packets generated from an original stream of a particular protocol (e.g. RTP, RTCP, SRTP, MIKEY etc.). The FEC Source packet generated is sent according to normal UDP procedures.

3. The FEC encoder generates repair symbols from a source block and the FEC Streaming Framework places these symbols into FEC Repair packets, to be conveyed to the receiver(s). These repair packets are sent using normal UDP procedures to a unique destination port to separate them from any of the source packet flows. The ports to be used for FEC Repair packets are defined in the FEC Streaming Configuration Information.

2.2.3 Receiver Operation

The following describes a possible receiver algorithm, when receiving an FEC source or repair packet:

1. If an FEC Source packet is received (as indicated by the UDP flow on which was received):
   a. The original source packet is reconstructed by removing the Source FEC Payload ID, if used. The resulting packet may be buffered to allow time for the FEC repair.
   b. The Source FEC Packet Identification Information is determined from the Source FEC Payload ID, if used, or by other means.
   c. The SPI for the resulting packet is placed into the source block according to the Source FEC Packet Identification Information and the source block format described in Section 2.3.2. The IP addresses and UDP ports the packet was received on/sent from are used to determine the UDP flow ID within the SPI.
2. If an FEC repair packet is received (as indicated by the UDP flow on which it was received), the contained repair symbols are associated with a source block according to the Repair FEC Payload ID.
3. If at least one source packet is missing and at least one repair packet has been received for a source block then FEC decoding may be desirable. The FEC decoder determines if the source block constructed in step 1 plus the associated repair symbols received in step 2 contain enough symbols for decoding of any or all of the missing source symbols in the source block and, if so, performs a decoding operation.
4. Any SPI that was reconstructed during the decoding operation is then used to reconstruct the missing source packets and these are buffered as normal received source packets (see step 1a above).

Note that the above procedure may result in a situation in which not all original source packets are recovered.

Source packets which are correctly received and those which are reconstructed may be delivered to the application out of order and in a different order from the order of arrival at the receiver. Alternatively, buffering and packet re-ordering may be required to re-order received and reconstructed source packets into the order they were placed into the source block, if that is necessary according to the application.

2.3 Protocol Specification 2.3.1 General

This section specifies the protocol elements for the FEC Streaming Framework. The protocol comprises three components which are described in the following sections:

1. Construction of a source block from source packets. The FEC code will be applied to this source block to produce the repair data.
2. A format for packets containing source data.
3. A format for packets containing repair data.

The operation of the FEC Streaming Framework is governed by certain FEC Streaming Configuration Information. This configuration information is also defined in this section. A complete protocol specification that uses this framework should specify the means to determine and communicate this information between sender and receiver.

2.3.2 Structure of the source block

This clause defines the layout of the source block. The source block comprises a concatenation of SPI for at least one original source UDP packet.

Let n be the number of UDP packets in the source block. n may be determined dynamically during the source block construction process.

T be the source symbol size in bytes. Note: this information is provided by the FEC Scheme as defined in Section 2.3.6

R[i] denote the octets of the UDP payload of the i-th UDP packet to be added to the source block, $0<=i<n$.

l[i] be the length of R[i] in octets

L[i] denote two octets representing the value of l[i] in network byte order (high order octet first)

f[i] denote an integer 'UDP flow ID' identifying the UDP flow from which the i-th packet was taken F[i] denote a single octet representing the value of f[i]

s[i] be the smallest integer such that $[i]*T>=(l[i]+3)$ note s[i] is the length of SPI[i] in units of symbols.

P[i] denote $s[i]*T-(l[i]+3)$ zero octets. Note: P[i] are padding octets to align the start of each UDP packet with the start of a symbol.

SPI[i] be the concatenation of F[i], L[i], R[i] and P[i].

Then, the source block is constructed by concatenating SPI[i] for i=0, 2, . . . n-1. The source block size, S, is then given by sum $\{s[i]*T, i=0, \ldots, n-1\}$.

Source blocks are identified by integer Source Block Numbers and symbols within a source block by integer Encoding Symbol IDs. This section does not specify how Source Block Numbers are allocated to source blocks. Symbols are numbered consecutively starting from zero within the source block. Each source packet is associated with the Encoding Symbol ID of the first symbol containing SPI for that packet. Thus, the Encoding Symbol ID value associated with the j-th source packet, ESI[j], is given by $$ESI[j]=0, \text{ for } j=0$$

$$ESI[j]=\text{sum}\{s[i], i=0, \ldots, (j-1)\}, \text{ for } 0<j<n$$

The Source FEC Packet Identification Information comprises the identity of the source block and the Encoding Symbol ID associated with the packet.

A UDP flow is uniquely defined by an IP source and destination address and UDP source and destination port values. The assignment of UDP flow ID values to UDP flows is part of the FEC Streaming Configuration Information.

2.3.3 Packet Format for FEC Source Packets

Figure 3:
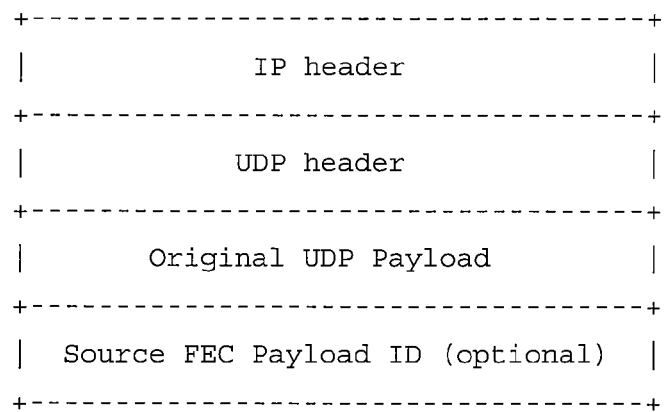
FIG. 3 is a diagram of an FEC source packet.

The packet format for FEC Source packets should be used to transport the payload of an original source UDP packet. As depicted in FIG. 3, it comprises the original UDP packet, followed, optionally, by the Source FEC Payload ID field, if used.

The IP and UDP header fields should be identical to those of the original source packet. The Original UDP Payload field should be identical to the UDP payload of the original source packet. The UDP payload of the FEC Source packet should consist of the Original UDP Payload followed by the Source FEC Payload ID field.

The Source FEC Payload ID field, if present, contains information required for the operation of the FEC algorithm, in particular for the derivation of the Source FEC Packet Identification Information. The format of the Source FEC Payload ID and the derivation of the Source FEC Packet Identification Information are defined by the FEC Scheme. Note that the FEC Scheme or CDP may define a means to derive the Source FEC Packet Identification Information from other information in the source packet (for example the RTP Sequence number). In this case the Source FEC Payload ID field described here is not appended to the packet and the Source FEC packet is identical in every way to the original Source packet.

2.3.4 Packet Format for FEC Repair Packets

Figure 4:
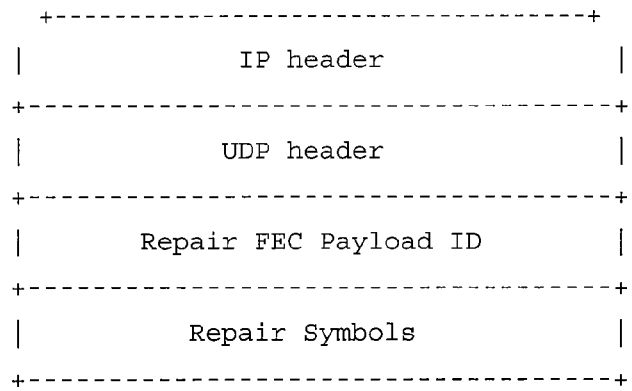
FIG. 4 is a diagram of an FEC repair packet.

The packet format for FEC Repair packets is shown in FIG. 4. The UDP payload comprises a Repair FEC Payload ID field and one or more repair symbols generated by the FEC encoding process. The Repair FEC Payload ID field contains information required for the operation of the FEC algorithm. This information is defined by the FEC Scheme. The format of the Repair FEC Payload ID field is defined by the FEC Scheme.

Any number of whole repair symbols may be contained within an FEC Repair packet, subject to packet size restrictions or other restrictions defined by the FEC Scheme. The number of repair symbols within a packet can be determined from the symbol length and the packet length. Partial repair symbols should not be included in FEC repair packets.

2.3.5 FEC Streaming Configuration Information

The FEC Streaming Configuration Information is information that the FEC Streaming Framework needs in order to apply FEC protection to the UDP flows. A complete Content Delivery Protocol specification for streaming that uses the framework specified here should include details of how this information is derived and communicated between sender and receiver.

The FEC Streaming Configuration Information includes identification of a number of UDP packet flows. Each UDP packet flow is uniquely identified by a tuple {Source IP Address, Destination IP Address, Source UDP port, Destination UDP port}.

A single instance of the FEC-SF provides FEC protection for all packets of a specified set of source UDP packet flows, by means of one or more UDP packet flows containing repair packets. The FEC Streaming Configuration Information includes, for each instance of the FEC-SF:

1. Identification of the UDP packet flow(s) carrying FEC Repair packets, known as the FEC repair flow(s).
2. For each source UDP packet flow protected by the FEC repair flow(s):
   a. Identification of the UDP packet flow carrying source packets.
   b. An integer identifier, between 0 and 255, for this flow. This identifier should be unique amongst all source UDP packet flows which are protected by the same FEC repair flow.
3. The FEC Encoding ID, FEC Instance ID (if applicable) and, optionally, the symbol size.

Item (3) above is included in the FEC Object Transmission Information.

Multiple instances of the FEC-SF, with separate and independent FEC Streaming Configuration Information, may be present at a sender or receiver. A single instance of the FEC-SF protects all packets of all the source UDP packet flows identified in (2) above i.e. all packets on those flows should be FEC Source packets as defined in Section 2.3.3. A single source UDP packet flow should not be protected by more than one FEC-SF instance.

A single FEC repair flow provides repair packets for a single instance of the FEC-SF. Other packets should not be sent within this flow i.e. all packets in the FEC repair flow should be FEC repair packets as defined in Section 2.3.4 and should relate to the same FEC-SF instance.

The FEC-SF requires to be informed of the symbol size to be used for each source block. This information may be included in the FEC Streaming Configuration Information or it may be communicated by other means, for example within the FEC Repair Payload ID field. A complete Content Delivery Protocol specification should specify how this information is communicated between sender and receiver.

2.3.6 FEC Scheme Requirements

The preferred FEC scheme is systematic, is based on discrete source blocks, specifies how the Source Block Number and Encoding Symbol ID associated with a source packet are derived or communicated from sender to receiver (for example, within the Source FEC Payload ID field), and specifies how the symbol length is derived or communicated from sender to receiver (for example, as part of the FEC Object Transmission Information).

3. FEC Schemes for Streaming

3.1 MSCR FEC Scheme for Arbitrary Packet Flows

This clause defines a FEC Scheme for MSCR protection of arbitrary packet flows over UDP.

3.1.1 Formats and Codes

3.1.1.1 FEC Object Transmission Information

3.1.1.1.1 FEC Object Transmission Element

The FEC Object Transmission Element, FEC Encoding ID is set to a predetermined value.

3.1.1.1.2 Common

Figure 5:
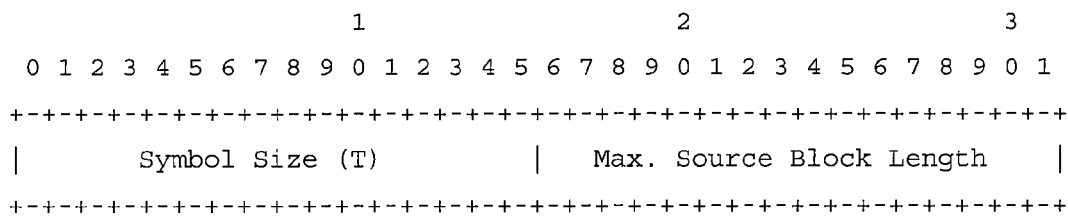
FIG. 5 is a diagram of an FEC object information block.

This Common FEC Object Transmission Information elements and their value ranges for this scheme are such that the Maximum Source Block Length is a non-negative integer less than $2^{16}$, in units of symbols, and the Encoding Symbol Size is a non-negative integer less than $2^{16}$, in units of bytes. The format for the encoded Common FEC Object Transmission Information elements can be a four-octet field defined in FIG. 5.

3.1.1.2 FEC Payload ID

3.1.1.2.1 Source FEC Payload ID

Figure 6:
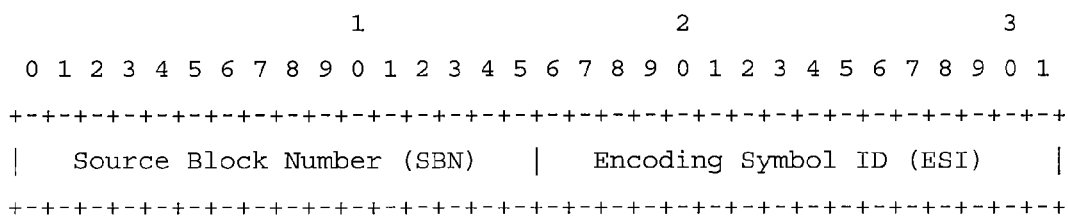
FIG. 6 is a diagram of a source FEC payload ID format.

The Source FEC payload ID might be as shown in FIG. 6. There, the Source Block Number (SBN) (16 bits) is an integer identifier for the source block that the source data within the packet relates to, and the Encoding Symbol ID (ESI) (16 bits) is the starting symbol index of the source packet in the source block. The interpretation of the Encoding Symbol Identifier is defined by the FEC Streaming Framework (See Section 2).

3.1.1.2.2 Repair FEC Payload ID

Figure 7:
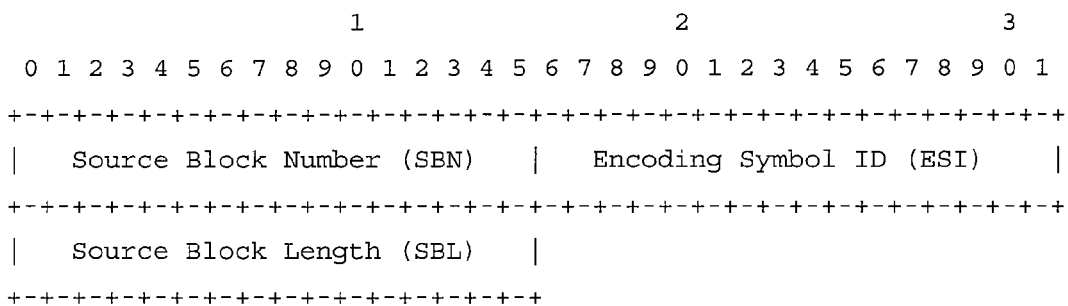
FIG. 7 is a diagram of a repair FEC payload ID format.

The structure of the Repair FEC Payload ID is defined in FIG. 7, where the Source Block Number (SBN) (16 bits) is an integer identifier for the source block that the repair symbols within the packet relate to, the Encoding Symbol ID (ESI) (16 bits) is an integer identifier for the encoding symbols within the packet, and the Source Block Length (SBL) (16 bits) is the number of source symbols in the source block. The interpretation of the Source Block Number, Encoding Symbol Identifier and Source Block Length can be as defined by the FEC Code Specification.

3.1.2 Procedures

This FEC Scheme uses the procedures of the framework defined in Section 2 to construct a source block to which the FEC code can be applied. The sender should allocate Source Block Numbers to source blocks sequentially, wrapping around to zero after Source Block Number 216-1. The sender should not construct source blocks which are larger than the Maximum Source Block Length signaled within the FEC Object Transmission Information.

3.1.3 FEC Code Specification

The source block passed to the MSCR FEC encoder comprises the Source Block constructed according to Section 3.1.2 extended with zero or more padding symbols such that the total number of symbols in the source block is equal to the Maximum Source Block Length signaled in the FEC Object Transmission Information (see Section 3.1.1.1.2). Thus the value of K used by the FEC encoded is equal to the Maximum Source Block Length. Padding symbols can be bytes set to the value zero.

The symbol size, T, to be used for source block construction and the repair symbol construction are is equal to the Encoding Symbol Size signaled in the FEC Object Transmission Information (see Section 3.1.1.1.2). The parameter T is set such that the number of source symbols in any source block is at most KMAX=8192.

Recommended parameters are presented in section 3.1.3.3.

3.1.3.1 Encoding Packet Construction

As described in section 2.3.4, each repair packet contains the the Source Block Number (SBN), the Encoding Symbol ID (ESI), the Source Block Length (SBL), and the repair symbol(s).

The number of repair symbols contained within a repair packet is computed from the packet length. The ESI values placed into the repair packets and the repair symbol triples used to generate the repair symbols are computed as described in sub-clause C.3.2.2 of [2].

The Source Block Length field of the Repair FEC Payload ID field is set to the number of symbols included in the Source Packet Information of packets associated with the source block, i.e., before padding to the Maximum Source Block Length.

3.1.3.2 Transport

This sub-clause describes the information exchange between the MSCR encoder/decoder and any transport protocol making use of MSCR FEC for streaming.

The MSCR encoder for streaming uses the following information from the transport protocol for each source block:
  The symbol size, T, in bytes
  The number of symbols in the source block, K
  The Source Block Number (SBN)
  The source symbols to be encoded, K·T bytes The MSCR encoder supplies the transport protocol with encoding packet information comprising, for each repair packet:
  Source Block Number (SBN)
  Encoding Symbol ID (ESI)
  Source Block Length (SBL)
  repair symbol(s)

The transport protocol communicates this information transparently to the MSCR decoder.

A suitable transport protocol is defined in this specification.

3.1.3.3 Example Parameters

3.1.3.3.1 Parameter Derivation Algorithm

This section provides recommendations for the derivation of the transport parameter T. This recommendation is based on the following input parameters:
  B the maximum source block size, in bytes
  P the maximum repair packet payload size (not including Repair FEC Payload ID), in bytes, which should be multiple of A
  A the symbol alignment factor, in bytes
  $K_{MAX}$ the maximum number of source symbols per source block. As defined in [2], KMAX=8192.
  $K_{MIN}$ a minimum target on the number of symbols per source block
  $G_{MAX}$ a maximum target number of symbols per repair packet A requirement on these inputs is that $\text{ceil}(B/P) \leq K_{MAX}$ Based on the above inputs, the transport parameter T is calculated as follows:

Let, $G = \min\{\text{ceil}(P \cdot K_{MIN}/B), P/A, G_{MAX}\}$ – the approximate number of symbols per packet $T = \text{floor}(P/(A \cdot G)) \cdot A$ The value of T derived above should be considered as a guide to the actual value of T used. It may be advantageous to ensure that T divides into P, or it may be advantageous to set the value of T smaller to minimize wastage when full size repair symbols are used to recover partial source symbols at the end of lost source packets (as long as the maximum number of source symbols in a source block does not exceed $K_{MAX}$). Furthermore, the choice of T may depend on the source packet size distribution, e.g., if all source packets are the same size then it is advantageous to choose T so that the actual payload size of a repair packet P', where P' is a multiple of T, is equal to (or as few bytes as possible larger than) the number of bytes each source packet occupies in the source block.

Recommended settings for the input parameters, A, $K_{MIN}$ and $G_{MAX}$ are A=16, $K_{MIN}$=640, $G_{MAX}$=10.

3.1.3.3.2 Examples

The above algorithm leads to transport parameters as shown in Table 3 below, assuming the recommended values for A, $K_{MIN}$ and $G_{MAX}$ and P=1424:

TABLE 3

Example parameters settings

| Max source block size B | G | Symbol size T | G·T |
|---|---|---|---|
| 16 KB | 10 | 128 | 1280 |
| 32 KB | 10 | 128 | 1280 |
| 128 KB | 7 | 192 | 1344 |
| 256 KB | 4 | 352 | 1408 |

3.2 MSCR FEC Scheme for a Single Sequenced Packet Flow

This section defines an alternative FEC Scheme for FEC protection of a single packet flow in which source packets each carry a unique sequence number. We call such a packet flow a "sequenced flow". A primary example would be FEC protection of an RTP flow containing an MPEG-2 Transport Stream within which all data for the service is multiplexed. In this case the RTP Sequence Numbers can be used to derive the Source FEC Packet Identification Information.

Compared to the FEC Scheme defined in Section 3.1, the primary advantage of this scheme is that it does not modify source packets in any way. As a result this FEC scheme can be used in the presence of legacy equipment which would not recognize source packets which had been modified according to the schemes defined in Section 3.1.

In this FEC Scheme, the role played by the Source FEC Payload ID in the scheme of Section 3.1 is replaced by the sequence number. The sequence numbers of packets within each flow to be protected should be incremented by one for each packet in the stream.

The size of the Source Packet Information within a given Source Block for each packet within a given sequenced flow should be the same and is derived from the size of the FEC Repair packets, which should also all be the same size for a given source block.

3.2.1 Formats and Codes

3.2.1.1 FEC Object Transmission Information

3.2.1.1.1 Mandatory

This FEC Scheme is identified by a predetermined FEC Encoding ID.

3.2.1.1.2 Common

See Section 3.1.1.1.2

3.2.1.1.3 Scheme Specific

No Scheme-specific FEC Object Transmission Information is defined by this FEC Scheme.

3.2.1.2 FEC Payload ID
3.2.1.2.1 Source FEC Payload ID

The Source FEC Payload ID field is not used by this FEC Scheme. Source packets are not modified in any way by this FEC Scheme.

3.2.1.2.2 Repair FEC Payload ID

The Repair FEC Payload ID format for this FEC Scheme is shown in FIG. 8. There, the Initial Sequence Number (Flow i ISN) is a 16-bit field that specifies the lowest 16 bits of the sequence number of the first packet to be included in this sub-block. If the sequence numbers are shorter than 16 bits then the received Sequence Number is logically padded with zero bits to become 16 bits in length respectively. The Encoding Symbol ID (ESI) is a 16-bit field that indicates which repair symbols are contained within this repair packet. The ESI provided is the ESI of the first repair symbol in the packet. The Source Block Length (SBL) is a 16-bit field that the length of the source block in symbols.

3.2.2 Procedures

This FEC Scheme uses the procedures of the framework defined in Section 2 to construct a source block to which the FEC code can be applied. In addition to the procedures defined there, the following procedures apply.

3.2.2.1 Derivation of Source FEC Packet Identification Information

The Source FEC Packet Identification Information for a source packet is derived from the sequence number of the packet and information received in the Repair FEC packets. Source blocks are identified by the sequence number of the first source packet in the block. This information is signaled in all Repair FEC packets associated with the source block in the Initial Sequence Number field.

The length of the Source Packet Information (in bytes) for source packets within a source block is equal to length of the payload containing encoding symbols of the repair packets (i.e. not including the Repair FEC Payload ID) for that block, which should all be the same. The Source Packet Information Length (SPIL) in symbols is equal to this length divided by the Encoding Symbol Size (which is signaled in the Common FEC Object Transmission Information).

The set of source packets which are included in the source block is determined from the Initial Sequence Number (ISN) and Source Block Length (SBL) as follows:

Let,

I be the Initial Sequence Number of the source block
    $L_P$ be the Source Packet Information Length in symbols
    $L_B$ be the Source Block Length in symbols Then, source packets with sequence numbers from I to $I+L_B/L_P-1$ inclusive are included in the source block.

Note that if no FEC Repair packets are received, then no FEC decoding is possible and it is unnecessary for the receiver to identify the Source FEC Packet Identification Information for the source packets.

The Encoding Symbol ID for a packet is derived from the following information:
The sequence number, Ns, of the packet
The Source Packeting Information Length for the source block, LP
The Initial Sequence Number of the source block, I Then the Encoding Symbol ID for packet with sequence number Ns is determined by the following formula:

$$ESI=(Ns-I) \cdot L_P$$

Note that all repair packet associated to a given Source Block should contain the same Source Block Length, Source Packet Information Length and Initial Sequence Number.

3.2.2.2 Derivation of Repair Packet Encoding Symbol IDs

The Encoding Symbol ID for a repair packet indicates which repair symbols the packet contains. This is given directly by the Encoding Symbol ID field of the Repair FEC Payload ID.

3.2.2.3 Procedures for RTP Flows n the specific case of RTP packet flows, then the RTP Sequence Number field is used as the sequence number in the procedures described above.

3.2.3 FEC Code Specification

The requirements of section 3.1.3 apply.

3.2.3.1 Example Parameters

3.2.3.1.1 Parameter Derivation Algorithm

It is recommended that the algorithm of Section 3.1.3.3.1 is used.

In the case of RTP streams carrying MPEG-2 Transport Streams, then the maximum repair packet size should be set to $$P=\text{ceil}((n \cdot 188+15)/A) \cdot A$$

Where n is the nominal number of 188 byte TS packets per IP Source packet.

The maximum source block size is determined by application configuration at the sender.

3.2.3.1.2 Examples

The above algorithm leads to transport parameters for MPEG-2 Transport Streams as shown in Table 4 below, assuming the recommended values for A, $K_{MIN}$ and $G_{MAX}$:

| Maximum packets per protection period | Nominal TS packets per IP packet | Maximum Packet Size, P | Maximum Source Block Size, B | G | Symbol size T |
| --- | --- | --- | --- | --- | --- |
| 100 | 7 | 1344 | 134400 | 6 | 224 |
| 200 | 7 | 1344 | 268800 | 3 | 448 |
| 300 | 7 | 1344 | 403200 | 2 | 672 |

4 Common Protocol Elements

This section defines a number of common protocol elements which can be used in conjunction with the framework defined in Section 2 and the FEC Schemes defined in Section 3 to construct complete protocols for FEC protection of streaming media.

4.1 FEC Feedback protocol
4.1.1 General

This section specifies a simple, optional, protocol for receivers to provide feedback about the reception of FEC data in the case of unicast streams. This feedback may be used by senders to adapt the FEC parameters. Feedback is provided about the reception and decoding success or failure for groups of source blocks, known as 'feedback groups'.

The capability to accept feedback must be advertised by the sender to the receiver, along with the IP address and destination UDP port to which the feedback should be sent and the requested size of the feedback groups on which feedback is requested.

Feedback is provided on a "best-effort" basis—senders should not rely on receiving feedback messages.

In this version of the protocol, a single Feedback Report message is provided which provides feedback on a single feedback group.

The following information is provided in each feedback report:
The number of source blocks in the feedback group
The number of source blocks in the feedback group received without error The number of successfully decoded source blocks in the feedback group The number of source blocks which could not be decoded in the feedback group The maximum number of packets received for any source block in the feedback group The minimum number of packets received for any source block in the feedback group The total number of received packets for the feedback 4.1.2 Formats and Codes 4.1.2.1 General Message Format FEC Feedback Protocol messages are sent over UDP with the UDP payload formatted according to FIG. 9. In such messages, the Version field is set to zero (0) in this version of the protocol Message type:

0x00 Feedback report

0x01-0xff Reserved

Source Block Identifier:

Identifies the first source block in the group this report refers to. If the FEC Scheme defines a Source Block Number, then this is used as the Source Block Identifier.

Number of source blocks:

The number of source blocks to which this report refers

Payload:

The contents of the payload field depend on the message type and are defined below.

4.1.2.2 Message Payload Format

The format of the Payload field for the Feedback report is defined in FIG. 10.

Number of "Error Free" Blocks: indicates the number of source blocks from the feedback group for which decoding was not required because all source packets were received without error.

Number of "Decoding Successful" blocks: indicates the number of source blocks from the feedback group for which decoding was required and was completed successfully.

Number of "Decoding Unsuccessful" blocks: indicates the number of source blocks from the feedback group for which decoding was required but could not be completed successfully due to insufficient information being received.

Max Packets Received: indicates the maximum number of packets (source and repair) that were received for any source block in the feedback group.

Min Packets Received: indicates the minimum number of packets (source and repair) that were received for any source block in the feedback group.

Total packets received: indicates the total number of packets (source and repair) that were received for all source blocks in the feedback group.

4.1.3 Procedures 4.1.3.1 FEC Sender Procedures

This section defines the procedures at the device which is sending FEC protected data and receiving FEC Feedback Protocol data.

4.1.3.1.1 General

The support of the FEC Feedback Protocol at senders is optional. Senders advertise support of the FEC Feedback Protocol, the highest version supported, the IP destination address and UDP destination port that messages should be sent to and the requested size of feedback groups in the FEC Streaming Configuration Information. The mechanism used to communicate the FEC Streaming Configuration Information is Content Delivery Protocol specific.

The FEC Sender can ignore FEC Feedback Protocol packets received with an unrecognized version number and FEC Feedback Protocol packets received with a reserved message type.

In the case the FEC Feedback Protocol messages are received which are longer than expected, the Sender should discard the additional bytes and process the message as normal.

4.1.3.1.2 Receipt of Feedback Report Messages

On receipt of a Feedback Report message, the FEC Sender may adapt the FEC parameters (source block size, sending rate and arrangement etc.) for subsequent source blocks based on the information received in the Feedback Report Message.

In the case that the feedback group size is a single source block, and if the Feedback Report indicates that the source block was received successfully or was successfully decoded, and the FEC Sender is still sending FEC repair packets for the source blocks, then the FEC Sender should stop sending FEC repair packets for the source block.

4.1.3.2 FEC Receiver Procedures

This section defines the procedures at the device which is receiving FEC protected data and sending FEC Feedback Protocol data.

4.1.3.2.1 General

The support of the FEC Feedback Protocol at receivers is optional.

If support of the FEC Feedback Protocol has not been advertised by the FEC Sender, then the FEC Receiver should not send FEC Feedback Protocol messages.

If support of the FEC Feedback Protocol has been advertised by the FEC Sender, then the FEC Receiver can use the information in the FEC Streaming Configuration Information to determine the highest version supported by the FEC Sender, the IP destination address and UDP destination port that messages should be sent to and the size of the feedback groups.

The FEC Receiver should not send FEC Feedback Protocol messages with a version number which is higher than the highest version supported by the FEC Sender.

The FEC Receiver should determine on a per FEC Streaming Framework instance basis whether the FEC Feedback Protocol will be used. A feedback group should comprise a consecutive sequence of Source Blocks except that Source Blocks for which no repair packets have been received should not be included in any feedback group. The number of source blocks in a feedback group should be equal to the requested feedback group size indicated in the FEC Streaming Configuration Information.

Each Source Block in the feedback group should be categorised either "Error Free", "Decoding Successful" or "Decoding Unsuccessful" as described in the following sections.

The FEC receiver should send a Feedback Report message immediately that the category of all Source Blocks in the feedback group is determined.

4.1.3.2.2 "Error Free" Source Blocks

A Source Block can be considered "Error free" immediately that the FEC Receiver determines that FEC decoding will not be necessary for a source block.

4.1.3.2.3 "Decoding Successful" Source Blocks

A Source Block can be considered as "Decoding Successful" immediately on successful decoding of the Source Block.

4.1.3.2.4 "Decoding Unsuccessful" Source Blocks

A Source Block can be considered as "Decoding Unsuccessful" immediately that the FEC Receiver determines that FEC decoding for the source block is necessary but is not possible. The FEC Receiver can determine that FEC decoding for a source block is necessary but is not possible at the point when:

at least one source symbol for the source block is unknown, insufficient repair symbols have been received to decode the source block, and source symbols are required by the application (e.g. media player).

The FEC Receiver may determine that FEC decoding for a source block is necessary but is not possible at other times, for example if no further repair symbols have been received for the source block for some time period determined by the FEC Receiver.

4.2 FEC Sending Arrangements

The FEC Streaming Framework defined in Section 2 does not prescribe any arrangement of transmitted packets. This section described approaches that may be used by the sender to determine the sending arrangement for the FEC Source and FEC Repair packets of the stream.

4.2.1 Simple Constant Rate FEC Sending

This section describes a simple sending arrangement in which the sending rate of FEC Source Packets and FEC Repair Packets is kept constant within each source block.

For each source block, source packets are sent first, followed by repair packets. All packets of one source block are sent before any packets of the subsequent block.

The sending data rate of all data (source and repair) is constant within the source block and given by the following formula:

$$R_{send} = R_{source} \cdot \left(1 + \frac{D_{repair}}{D_{source}}\right)$$

Where:
$R_{send}$ is the sending rate
$R_{source}$ is the source data rate
$D_{repair}$ is the amount of repair data (bytes, including packetisation overhead)
$D_{source}$ is the amount of source data (bytes, including packetisation overhead).

4.3 Determining FEC Source Block Boundaries

This sections presents a number of algorithms that may be used by the sender to determine FEC Source Block boundaries.

4.3.1 Protection Period Based

In this approach, Source Blocks are constructed based on a time period, known as a "protection period". In general, the protection period is the same for every source block of a stream. However, it may be varied on a block by block basis.

In the case of a real-time stream, the source packets of a source block are exactly those that arrive within a period of time equal to the protection period.

In the case of pre-encoded content, the source packets of a source block are exactly those that would be sent within a period of time equal to the protection period in the normal sending arrangement for a non-FEC protected stream generated from that content.

In this approach, using the sending arrangements of Sections 4.2.1 and elsewhere packets are buffered at the receiver for a time at least equal to the longest playout time of any source block.

5 Content Delivery Protocols

This section defines several complete Content Delivery Protocols, making use of the components defined in Sections 2-4.

5.1 Multicast MPEG-2 Transport Stream

This section defines a Content Delivery Protocol for FEC protected multicast delivery of MPEG-2 Transport Streams.

5.1.1 Control Protocols

Session information include:
The destination UDP port for each repair flow
The IP multicast address of each repair flow, if multiple repair flow layers are provided
The joining order of repair flows, if multiple repair flow layers are provided
The FEC Object Transmission Information (Maximum Source Block Size and Encoding Symbol Size)
The minimum buffering time required at the receiver
The Flow ID for the MPEG-2 TS flow is zero.

5.1.2 Transport Protocol

FEC protection of the MPEG-2 Transport Stream may be provided using
the FEC Streaming Framework described in Section 2
the FEC Scheme defined in Section 3.3
the FEC sending arrangement described in 4.2.1
the FEC source block boundary identification mechanism described in 4.3.1
Each MPEG-2 Transport Stream should be protected independently.

5.2 Unicast MPEG-2 Transport Stream

This section defines a Content Delivery Protocol for FEC protected unicast delivery of MPEG-2 Transport Streams.

5.2.1 Control Protocols

Session information can include:
The FEC Object Transmission Information (Maximum Source Block Size and Encoding Symbol Size)
The minimum buffering time required at the receiver
Requested FEC Feedback Group size (or zero if feedback not requested)
The Repair FEC flow associated with a unicast RTP flow can be sent to the destination UDP port number two higher than the destination UDP port to which the RTP flow is sent.
The Flow ID for the MPEG-2 TS flow is zero.
If FEC Feedback is requested by the sender and supported by the receiver, then FEC Feedback messages can be sent to the address/UDP port which are used as the source address/port for the FEC repair stream from server to receiver.

5.2.2 Transport Protocol

FEC protection of the MPEG-2 Transport Stream may be provided using
the FEC Streaming Framework described in Section 2
the FEC Scheme defined in Section 3.3
the FEC sending arrangement described in 4.2.1
the FEC source block boundary identification mechanism described in 4.3.1
Each MPEG-2 Transport Stream can be protected independently.

5.3 Generic Multicast Video

This section defines a Content Delivery Protocol for FEC protected multicast delivery of arbitrary audio/video streams (for example H.264 encapsulated in RTP). This section is provided to describe how FEC can be applied to future extensions to the DVB IPI Handbook which address direct encapsulation of audio/video streams in RTP.

5.3.1 Control Protocols

Session information includes:
The destination UDP port for each repair flow
The IP multicast address of each repair flow, if multiple repair flow layers are provided
The joining order of repair flows, if multiple repair flow layers are provided The FEC Object Transmission Information (Maximum Source Block Size and Encoding Symbol Size)

The IP Multicast addresses, UDP destination port numbers and Flow IDs of the protected UDP flows (for example audio and video flow).

The minimum buffering time required at the receiver 5.3.2 Transport Protocols

The audio/video stream is assumed to be carried by one or more UDP flows (probably RTP flows).

FEC protection of these UDP flows may be provided using
the FEC Streaming Framework described in Section 2
the FEC Scheme defined in Section 3.1
the FEC sending arrangement described in 4.2.1
the FEC source block boundary identification mechanism described in 4.3.1

5.4 Generic Unicast Video

This section defines a Content Delivery Protocol for FEC protected unicast delivery of arbitrary audio/video streams (for example H.264 encapsulated in RTP). This section is provided to describe how FEC can be applied to future extensions to the DVB IPI Handbook which address direct encapsulation of audio/video streams in RTP.

5.4.1 Control Protocols

Session information includes:

The destination UDP port for the repair flow

The FEC Object Transmission Information (Maximum Source Block Size and Encoding Symbol Size)

The UDP destination port numbers and Flow IDs of the protected UDP flows (for example audio and video flow).

The minimum buffering time required at the receiver

The FEC Feedback group size (or zero if FEC Feedback is not requested)

If FEC Feedback is requested by the sender and supported by the receiver, then FEC Feedback messages can be sent to the address/UDP port which are used as the source address/port for the FEC repair stream from server to receiver.

5.4.2 Transport Protocols

The audio/video stream is assumed to be carried by one or more UDP flows (probably RTP flows).

FEC protection of these UDP flows may be provided using
the FEC Streaming Framework described in Section 2
the FEC Scheme defined in Section 3.1
the FEC sending arrangement described in 4.2.1
the FEC source block boundary identification mechanism described in 4.3.1

6. FEC Streaming Recommendations

This section provides some further optional recommendations for the use of the above FEC streaming protocols in the DVB environment.

6.1 Multicast 6.1.1 Layered FEC Sending (Optional)

Senders may advertise more than on IP multicast address for repair packets associated with a single source stream. Senders should send distinct repair packets on each multicast group.

Receivers may join any number of such multicast groups in order to adapt the rate of received repair packets according to the local error rates.

However, it should be noted that in order to meet IPTV quality targets, sufficient overhead must be received to overcome even relatively rare error events and thus receivers should measure error rates over a sufficiently long period in order to determine the amount of repair data required.

6.2 Unicast 6.2.1 Source Block Construction at Stream Start (Optional)

Source Block boundaries should be identified using the protection period algorithm defined in Section 4.4.1. The following algorithm is recommended for determining the protection periods, FEC overhead and sending rate to be used at any point at which a new stream is to be played out (e.g. start of stream or when using trick-modes). This algorithm allocates the initial available bandwidth above the source rate evenly between FEC repair data and fast buffer fill data. The initial available bandwidth may be greater than the nominal (long term) bandwidth or it may be the same, but should not be less.

Let, $B_{max}$ be the initial bandwidth available to the stream (source and FEC)

$B_{nom}$ be the nominal bandwidth for the stream (source and FEC)

$B_{src}$ be the source bandwidth $P_{init}$ be the initial buffering delay $P_{final}$ be the target protection period P be the ith protection period for i=0, 1, ...

$S_{init}$ be the initial source sending rate $R_{init}$ be the initial repair sending rate Then, $$S_{init} = B_{src} + \max\left(\frac{B_{max} - B_{src}}{2}, B_{max} - B_{nom}\right)$$

$$P_0 = P_{init} \cdot \frac{S_{init}}{B_{src}}$$

$$R_{init} = B_{max} - S_{init}$$

and, for all i such that $P_i < P_{final}$, then $$P_{i+1} = P_i \cdot \frac{S_{init}}{B_{src}}$$

And for all i such that $P_i >= P_{final}$ $$P_{i+1} = P_i$$

For protection periods of duration less that Pfinal, the source sending rate should be Sinit and the repair sending rate Rinit. After this, the source sending rate should be reduced to Bsrc. This arrangement means that during the initial period the source sending rate is higher than the actual source data rate and thus each protection period contains data which will take longer to play out than it took to send. As a result the subsequent protection period can be made longer, according to the algorithm above, without starving the receiver.

The minimum buffering time at the receiver advertised in the Service Discovery information should be Pinit.

6.2.2 Use of FEC Feedback (Optional)

FEC Feedback may be used on a long term basis to adjust the FEC Overhead which is provided to an individual user. However, it should be noted that in order to meet IPTV quality targets, sufficient overhead must be provided to overcome even relatively rare error events and thus feedback data gathered over a short period of time is not sufficient to determine the long-term overhead required.

In the case that the protection period is significantly longer than the IP round trip time between sender and receiver, then FEC Feedback may be requested for feedback groups of a single source block. In this case, feedback reports may be used to abandon sending of FEC repair packets for a source block in a report is received indicating that this source block has been successfully received/decoded.

While the invention has been described with respect to exemplary embodiments, one skilled in the art will recognize that numerous modifications are possible. For example, the methods and processes described herein may be implemented using hardware components, software components, and/or any combination thereof. Thus, although the invention has been described with respect to exemplary embodiments, it will be appreciated that the invention is intended to cover all modifications and equivalents within the scope of the following claims.

What is claimed is:

1. A method for streaming data in a communication system, wherein data is streamed from a transmitter that transmits electrical signals conveying the data to a receiver that receives electrical signals that may convey some of the data, such that the receiver can begin to use the streamed data before it is all received or transmitted, the method comprising:
   encoding forward error correction ("FEC") for the data to be transmitted; and
   transmitting a stream including data and FEC information, whereby:
   the data is transmitted using a transmit rate that is greater than a consumption rate of the receiver;
   the transmit rate is less than or equal to a maximum transmit rate and is equal to a sum of a source sending rate and a repair sending rate; and
   wherein streaming is performed over a plurality of FEC source block protection periods, including at least a first protection period and a second protection period following the first protection period, each protection period having a source sending rate and a repair sending rate, with an amount of overhead used for FEC protection and an amount of overhead used for buffer filling varying over the plurality of FEC source block protection periods such that the source sending rate in the first protection period is greater than the source sending rate in the second protection period, and the repair sending rate in the first protection period is less than the repair sending rate in the second protection period, a timing for changing the source sending rate and the repair sending rate being based on a minimum buffering time at the receiver.

2. The method of claim 1, wherein transmitting the stream comprises transmitting using a constant transmit rate during the time of streaming transmission.

3. A non-transitory computer-readable medium, having an interface to provide instructions stored thereon to electronics that would execute such provided instructions, in order to implement streaming data in a communication system, wherein data is streamed from a transmitter to a receiver such that the receiver can begin to use the streamed data before it is all received or transmitted, the computer-readable medium having stored thereon:
   program code for encoding forward error correction ("FEC") for the data to be transmitted, whereby a transmitted stream includes data and FEC information; the data is transmitted using a transmit rate that is greater than a consumption rate of the receiver; the transmit rate is less than or equal to a maximum transmit rate and is equal to a sum of a source sending rate and a repair sending rate; and wherein streaming is performed over a plurality of FEC source block protection periods, including at least a first protection period and a second protection period following the first protection period, each protection period having a source sending rate and a repair sending rate, with an amount of overhead used for FEC protection and an amount of overhead used for buffer filling varying over the plurality of FEC source block protection periods such that the source sending rate in the first protection period is greater than the source sending rate in the second protection period, and the repair sending rate in the first protection period is less than the repair sending rate in the second protection period, a timing for changing the source sending rate and the repair sending rate being based on a minimum buffering time at the receiver.

4. The non-transitory computer readable medium of claim 3, wherein the transmit rate is constant during the time of streaming transmission.

5. A method for streaming data in a communication system, wherein data is streamed from a transmitter that transmits electrical signals conveying the data to a receiver that receives electrical signals that may convey some of the data, such that the receiver can begin to use the streamed data before it is all received or transmitted, the method comprising:
   encoding forward error correction ("FEC") for the data to be transmitted; and
   transmitting a stream including data and FEC information, whereby:
   the transmission is timed such that, at least for part of the transmission, a source sending rate of the transmitter is greater than a consumption rate of the receiver when the consumption rate is equal to a source data rate;
   a transmit rate is less than or equal to a maximum transmit rate and is equal to a sum of the source sending rate and a repair sending rate; and
   at least one of the amount of FEC and the excess of the source sending rate over the consumption rate is varied as a trade-off between FEC protection and buffer filling to reduce lag time before a receiver can begin to use the streamed data, a timing for the varying being based on a minimum buffering time at the receiver.

6. A non-transitory computer-readable medium, having an interface to provide instructions stored thereon to electronics that would execute such provided instructions, in order to implement streaming data in a communication system, wherein data is streamed from a transmitter to a receiver such that the receiver can begin to use the streamed data before it is all received or transmitted, the computer-readable medium having stored thereon:
   program code for encoding forward error correction ("FEC") for the data to be transmitted, whereby a transmitted stream includes data and FEC information;
   program code for timing transmission such that, at least for part of the transmission, a source sending rate of the transmitter is greater than a consumption rate of the receiver when the consumption rate is equal to a source data rate, whereby a transmit rate is less than or equal to a maximum transmit rate and is equal to a sum of the source sending rate and a repair sending rate; and
   program code for varying at least one of the amount of FEC and the excess of the source sending rate over the consumption rate, the varying being a trade-off between FEC protection and buffer filling to reduce lag time before a receiver can begin to use the streamed data, a timing for the varying being based on a minimum buffering time at the receiver.

* * * * *